(12) United States Patent
Tsai et al.

(10) Patent No.: US 11,081,479 B1
(45) Date of Patent: Aug. 3, 2021

(54) INTEGRATED CIRCUIT LAYOUT WITH ASYMMETRIC METAL LINES

(71) Applicant: TAIWAN SEMICONDUCTOR MANUFACTURING CO., LTD., Hsinchu (TW)

(72) Inventors: Wei-Hsin Tsai, Hsinchu (TW); Jung-Chan Yang, Taoyuan (TW); Ting-Yu Chen, Hsinchu (TW); Li-Chun Tien, Tainan (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/849,845

(22) Filed: Apr. 15, 2020

(51) Int. Cl.
| | |
|---|---|
| H01L 27/02 | (2006.01) |
| H01L 27/088 | (2006.01) |
| G06F 30/392 | (2020.01) |
| H01L 23/522 | (2006.01) |
| H01L 23/528 | (2006.01) |

(52) U.S. Cl.
CPC ........ *H01L 27/0207* (2013.01); *G06F 30/392* (2020.01); *H01L 23/5226* (2013.01); *H01L 23/5283* (2013.01); *H01L 27/0886* (2013.01)

(58) Field of Classification Search
CPC ............. H01L 27/0207; H01L 27/0886; H01L 23/5226; H01L 23/5283; G06F 30/392
USPC ........................................................ 257/401
See application file for complete search history.

(56) References Cited

U.S. PATENT DOCUMENTS 9,478,609 B2 * 10/2016 Chiang ............... H01L 29/0657

* cited by examiner

*Primary Examiner* — Tu-Tu V Ho
(74) *Attorney, Agent, or Firm* — Maschoff Brennan

(57) ABSTRACT

A semiconductor device includes a first group of semiconductor fins arranged at a first fin-to-fin spacing and a second group of semiconductor fins arranged at a second fin-to-fin spacing. The first and second groups of semiconductor fins are separated by a fin-free region larger than the first and second fin-to-fin spacings. The semiconductor device further includes a gate structure extending across the first and second group of semiconductor fins, a Vdd line and a Vss line extending across the gate structure. The first and second groups of semiconductor fins are between the Vdd line and the Vss line from a top view, and an overlapping area between the Vdd line and the first group of semiconductor fins is different from an overlapping area between the Vss line and the second group of semiconductor fins from the top view.

20 Claims, 18 Drawing Sheets

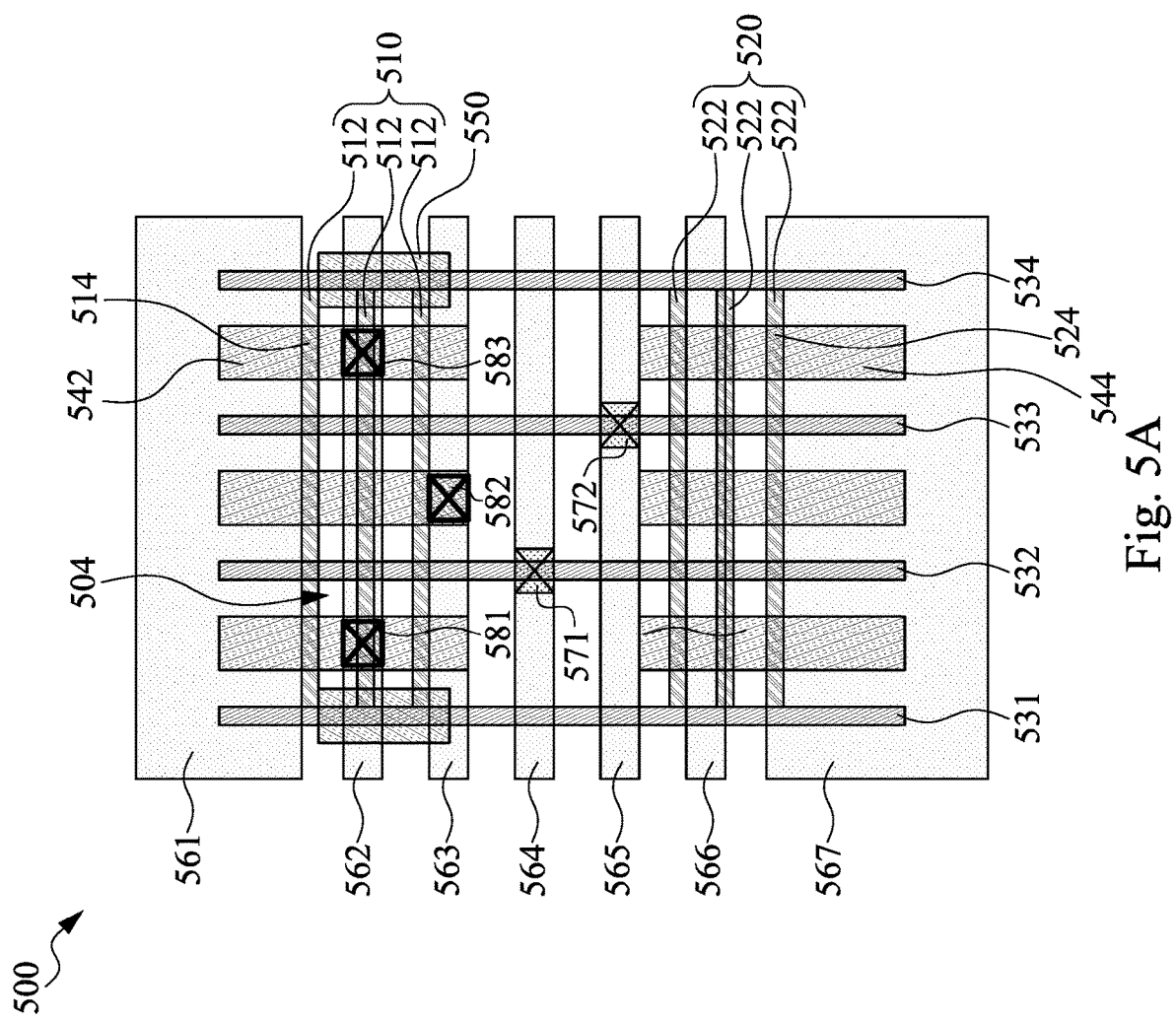

INTEGRATED CIRCUIT LAYOUT WITH ASYMMETRIC METAL LINES

BACKGROUND

As integrated circuits become smaller, layouts for the integrated circuits are changed to decrease the overall area occupied by an integrated circuit. Decreasing the area of the layout is accomplished by substituting new structures for integrated circuit elements that are smaller than previous versions of integrated circuit elements. Decreasing the area of the layout is also accomplished by reducing the distance between circuit elements in a layer of an integrated circuit.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 5A is a diagram of a layout of a semiconductor device, in accordance with some embodiments.

DETAILED DESCRIPTION

Figure 1A:
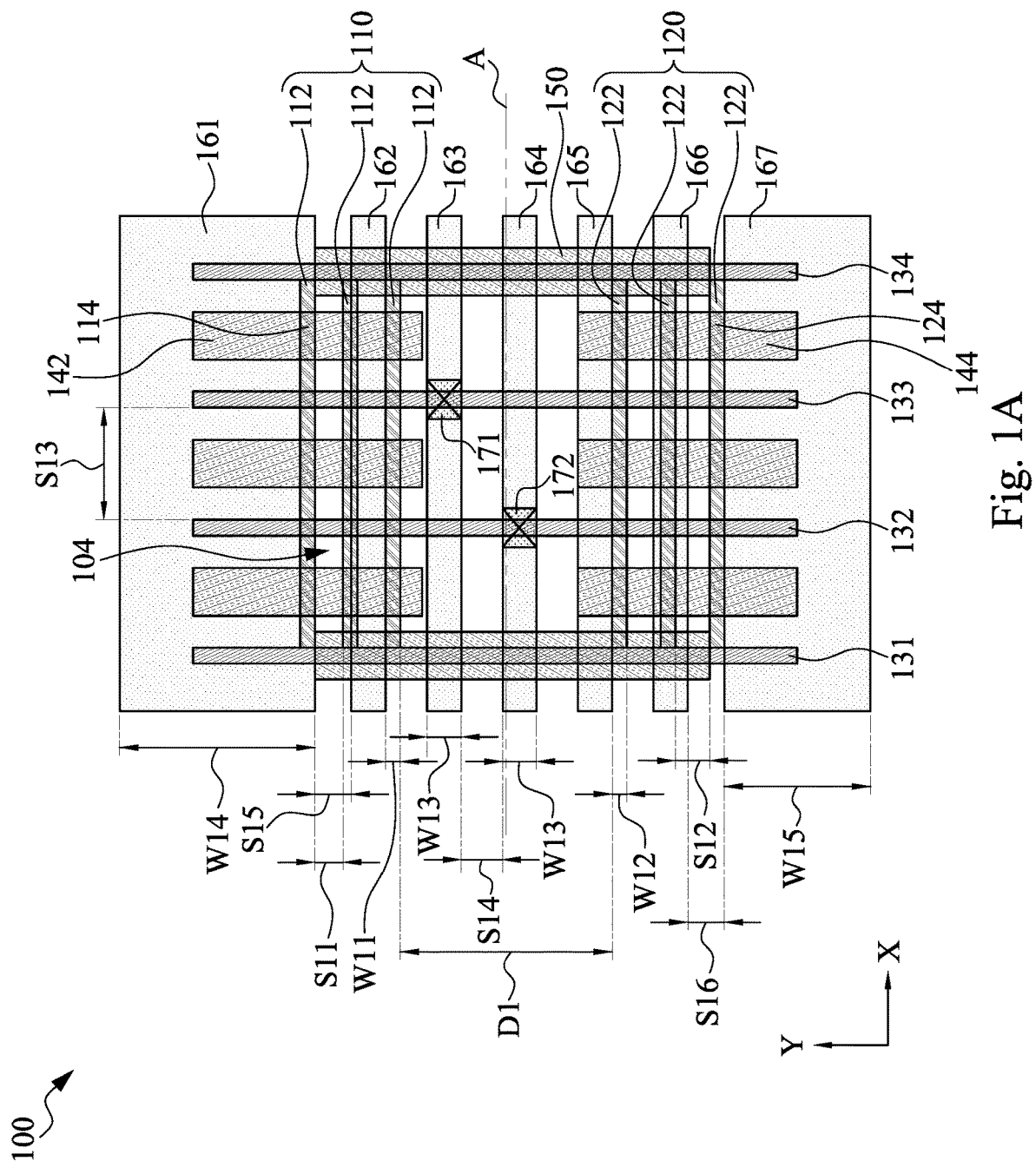
FIG. 1A is a diagram of a layout of a semiconductor device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Field effect transistors (FETs) are components of some integrated circuits. A FET includes a channel region and also a source region and a drain region (collectively referred to source/drain regions) spaced apart by the channel region. A gate electrode is over the channel region. By applying a voltage to the gate electrode, the conductivity of the channel region increases to allow current to flow from the source region to the drain region. A FET utilizes conductive a gate contact that electrically connects to the gate electrode to apply the gate voltage to the FET, and source/drain contacts that electrically connect to source/drain regions to conduct current to and from the FET. The gate contact receives gate voltage from a conductive line (interchangeably referred to as "M0" lines in the present disclosure) on a next level above the gate contact. Some integrated circuits include multiple groups of semiconductor fins, and each group of semiconductor fins may include, for example, three fins sharing common source/drain contacts and straddled by, for example, two gate structures. If two gate contacts landing on these two gate structures are designed to electrically connect to different nets, two M0 lines between the fin groups may be utilized to respectively connect to the two gate contacts. However, placing two M0 lines between neighboring fin groups might result in reduction of the fin number in one of the fin groups in order to leave enough space for the M0 lines. Alternatively, if the two gate contacts are designed to electrically connect to different nets using a same M0 line, an additional photolithography and etching step may be used to break the M0 line into separate segments for the different nets. However, the additional photolithography and etching step would lead to increased manufacture cost.

In some embodiments of the present disclosure, in a layout design of a semiconductor device, M0 lines are shifted such that the M0 lines are arranged in an asymmetric manner with respect to neighboring fin group layout patterns, each of which includes multiple fins (e.g., three fins). The asymmetric arrangement of the M0 lines allows for multiple M0 lines (e.g., two M0 lines) arranged between the neighboring fin group layout patterns without overlapping the fin group layout patterns. In this way, the M0 lines allow for multiple gate contacts (e.g., two gate contacts) electrically connected to different nets without either fin number reduction or additional photolithography and etching steps, as will be described in greater detail below.

Figure 1B:
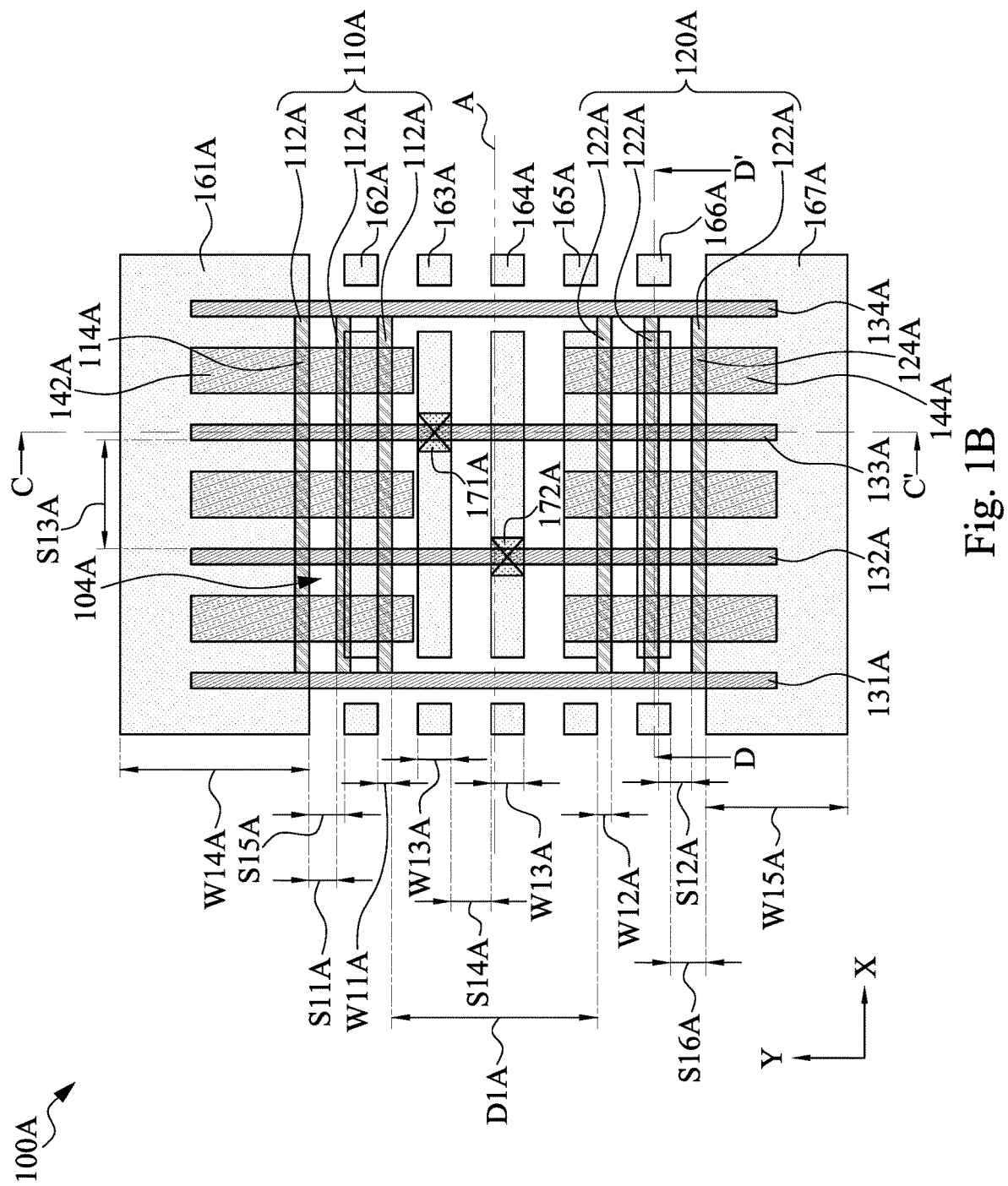
FIGS. 1B-1D are views of a semiconductor device fabricated using the layout of FIG. 1A, in accordance with some embodiments.
Figure 1C:
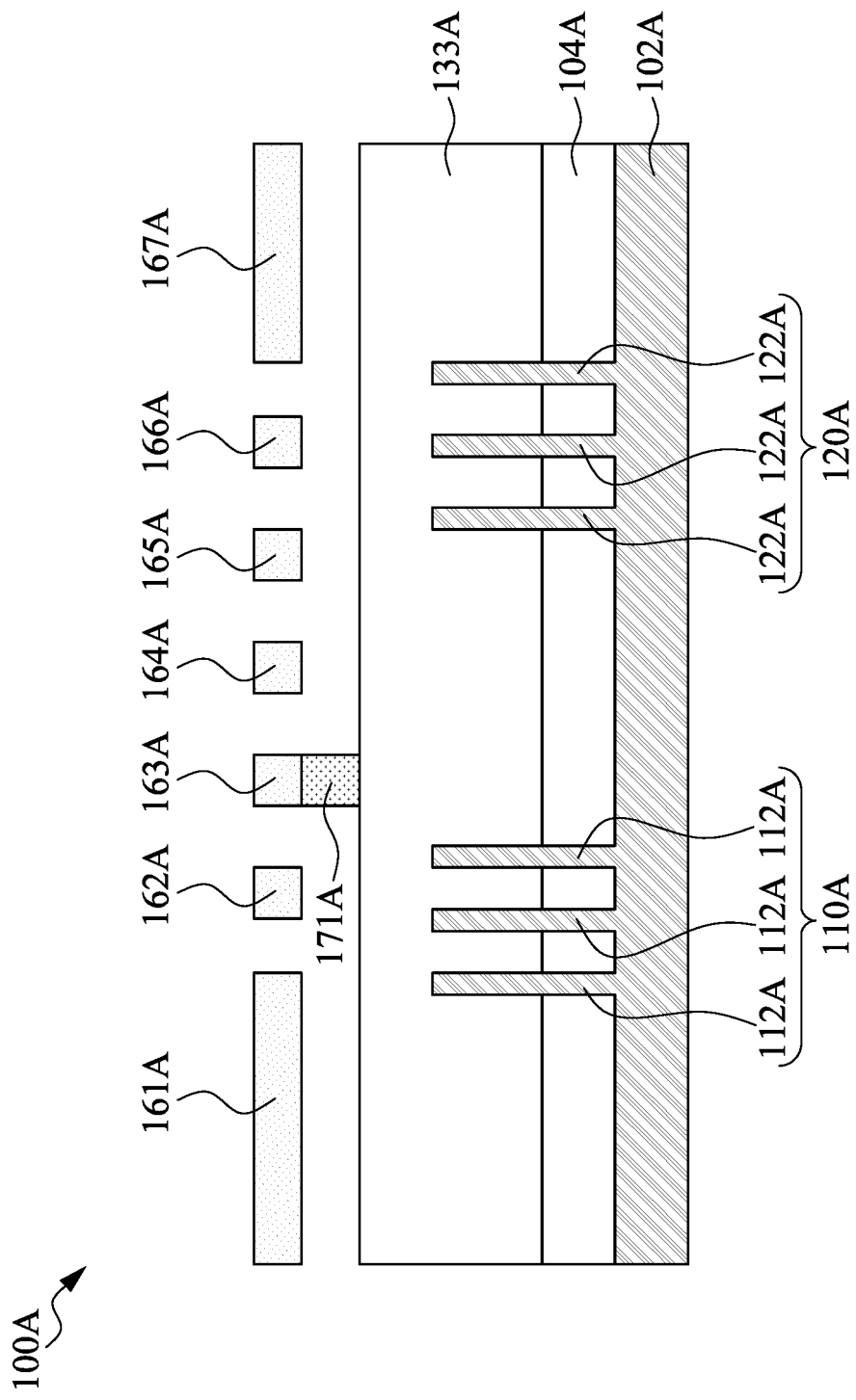
Figure 1D:
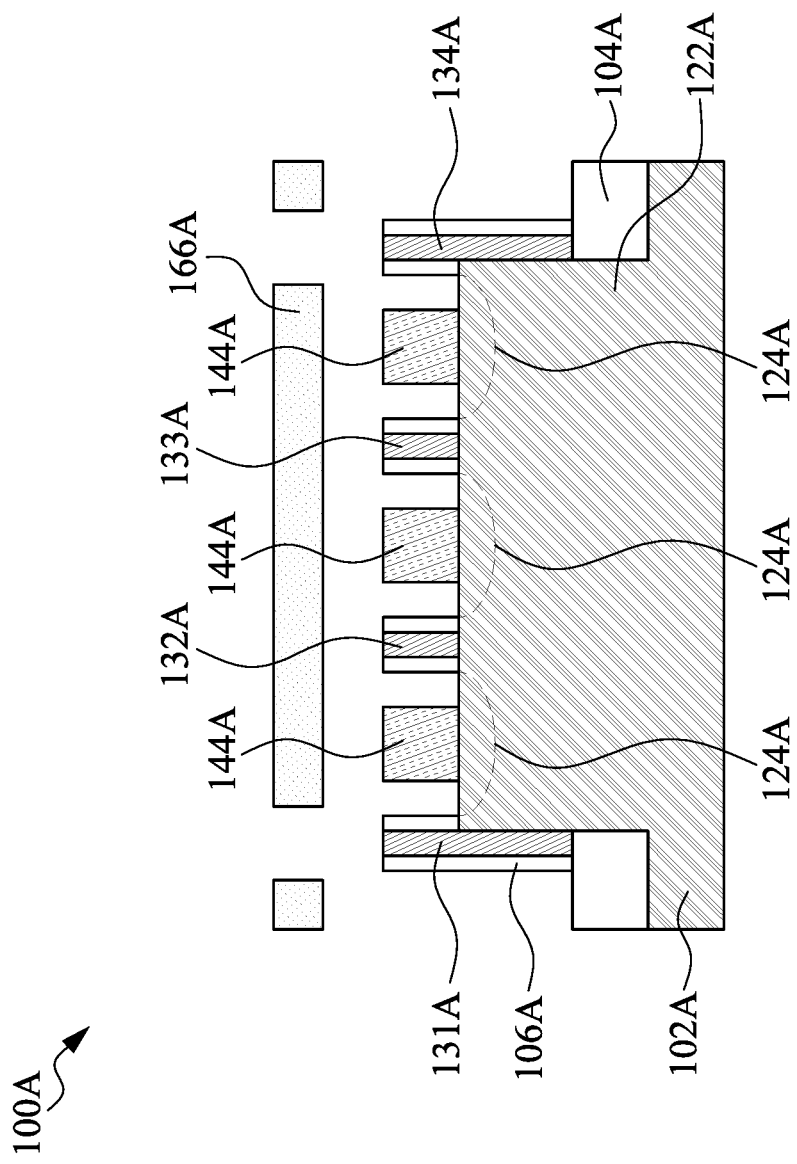

FIG. 1A is a diagram of a layout 100 of a semiconductor device, in accordance with some embodiments. The layout 100 is usable to manufacture a semiconductor device 100A as illustrated in FIGS. 1B-1D.

Referring to FIG. 1A, the layout 100 includes first and second fin group layout patterns 110 and 120. The first and second fin group layout patterns 110 and 120 define corresponding first and second fin group regions 110A and 120B (FIGS. 1B-1D) of the semiconductor device 100A. The first and second fin group layout patterns 110 and 120 extend along a first direction of the layout 100, e.g., the X direction, and spaced from each other along a second direction of the layout 100, e.g., the Y direction. In some embodiments, the second direction Y is perpendicular to the first direction X.

The first fin group layout pattern 110 includes three first fin layout patterns 112 extending along the X direction and spaced apart from each other along the Y direction. Each first fin layout pattern 112 is separated from an adjacent first fin layout pattern 112 in the Y direction by a first fin-to-fin spacing S11, and each first fin layout pattern 112 has a first fin width W11 measured in the Y direction. Similarly, the second fin group layout pattern 120 includes three second fin layout patterns 122 extending along the X direction and spaced apart from each other along Y direction. Each second fin layout pattern 122 is separated from an adjacent second fin layout pattern 122 in the Y direction by a second fin-to-fin spacing S12, and each second fin layout pattern 122 has a second fin width W12 measured in the Y direction. The first fin group layout pattern 110 is separated from the second fin group layout pattern 120 in the Y direction by a fin-free region D1, which is larger than the first and second fin-to-fin spacings S11 and S12. In some embodiments, the first fin-to-fin spacing S11 of the first fin layout patterns 112 is the same as the second fin-to-fin spacing S12 of the second fin layout patterns 122. In some other embodiments, the first fin-to-fin spacing S11 is different from the second fin-to-fin spacing S12. In some embodiments, the first fin width W11 of the first fin layout patterns 112 is the same as the second fin width W12 of the second fin layout patterns 122. In some other embodiments, the first fin width W11 is different from the second fin width W12. The first and second fin layout patterns 112 and 122 define corresponding first and second fins 112A and 122A (FIGS. 1B-1D) of the semiconductor device 100A. The fin layout patterns 112 and 122 are identified in the legend in the drawings with label "fin."

The first fin layout patterns 112 each include first source region layout patterns and drain region layout patterns (collectively referred to as first source/drain region layout patterns 114) that define corresponding first source/drain regions 114A (FIGS. 1B-1D) of the semiconductor device 100A. Similarly, the second fin layout patterns 122 each include second source region layout patterns and drain region layout patterns (collectively referred to as second source/drain region layout patterns 124) that define corresponding second source/drain regions 124A (FIGS. 1B-1D) of the semiconductor device 100A.

The fin layout patterns 112 and 122 are separated from each other and other components of the layout 100 on the same layout level by an isolation structure layout pattern 104. The isolation structure layout pattern 104 defines a corresponding isolation structure 104A (FIGS. 1B-1D) of the semiconductor device 100A.

The layout 100 further includes a plurality of gate layout patterns 131, 132, 133 and 134 over the fin group layout patterns 110 and 120. The gate layout patterns 131-134 define corresponding gate structures 131A, 132A, 133A and 134A (FIGS. 1B-1D) of the semiconductor device 100A. Each of the gate layout patterns 131-134 extends along the Y direction across the fin group layout patterns 110 and 120. Each of the gate layout patterns 131-134 is separated from an adjacent one of the gate layout patterns 131-134 in the X direction by a gate-to-gate spacing S13. The gate-to-gate spacing S13 is greater than the fin-to-fin spacings S11 and S12 in the depicted embodiments. The gate layout patterns 131-134 and corresponding source/drain region layout patterns 114 on opposite sides of the gate layout patterns 131-134 form a plurality of FETs. In some embodiments, the gate layout patterns 131-134 are also referred to as POLY layout patterns and are identified in the legend in the drawings with label "PO."

The layout 100 includes a plurality of first source/drain contact layout patterns 142 overlying the first source/drain region layout patterns 114 to provide electrical connections to the first source/drain region layout patterns 114. Moreover, the first source/drain contact layout patterns 142 extend along the Y direction across the first source/drain region layout patterns 114 of three first fins layout patterns 112, and thus the three first fin layout patterns 112 share common source/drain contact layout patterns 142. Similarly, the layout 100 further includes a plurality of second source/drain contact layout patterns 144 overlying the second source/drain region layout patterns 124 to provide electrical connections to the second source/drain region layout patterns 124. Moreover, the second source/drain contact layout patterns 144 extend along the Y direction across the second source/drain region layout patterns 124 of three second fins layout patterns 122, and thus the three second fin layout patterns 122 share common source/drain contact layout patterns 144.

The source/drain contact layout patterns 142 and 144 define corresponding source/drain contacts 142A and 144A of the semiconductor device 100A (FIGS. 1B-1D). Each of the source/drain contact layout patterns 142 and 144 extends in the second direction Y and between a corresponding pair of adjacent gate layout patterns 131-134. The source/drain contact layout patterns 142 and 144 are identified in the legend in the drawings with label "MD."

The layout 100 further includes a plurality of metal line layout patterns 161, 162, 163, 164, 165, 166 and 167 extending along the X direction and spaced apart from each other along the Y direction. The metal line layout patterns 161-167 define corresponding metal lines 161A-167A (FIGS. 1B-1D) of the semiconductor device 100A. The metal line layout patterns 161-167 are identified in the legend in the drawing with label "M0."

The metal line layout pattern 161 at an upper boundary of the layout 100 is a Vdd line layout pattern, and the metal line layout pattern 167 at a lower boundary of the layout 100 is a Vss line layout pattern. The metal line layout patterns 162-166 are arranged between the Vdd line layout pattern 161 and the Vss line layout pattern 167. Each of the metal line layout patterns 162-166 is separated from an adjacent one of the metal line layout patterns 162-166 in the Y direction by a line-to-line spacing S14, and each of the metal line layout patterns 162-166 has a line width W13 measured in the Y direction. In some embodiments, the line width of the metal line layout patterns 162-166 is greater than the fin widths W11 and W12 of the first and second fin layout patterns 112 and 122.

The metal line layout patterns 162-166 are shifted and thus arranged in an asymmetric manner with respect to the fin group layout patterns 110 and 120. In greater detail, the first and second fin group layout patterns 110 and 120 are symmetric about a symmetric axis A extending in the X direction, but the metal line layout patterns 162-166 are asymmetric about the symmetric axis A of the fin group layout patterns 110 and 120. The asymmetric arrangement of the metal line layout patterns 162-166 allows for the metal line layout patterns 163 and 164 arranged between the fin group layout patterns 110 and 120 without overlapping any one of the fin layout pattern 112 and 122.

The Vdd line layout pattern 161 has a Vdd line width W14 and the Vss line layout pattern 167 has a Vss line width W15 in the Y direction. In the depicted embodiments in FIG. 1A, the Vdd line width W14 is greater than the Vss line width W15, which in turn allows for shifting the metal line layout patterns 162-166 toward the second fin group layout pattern 120, while keeping a line-to-line spacing S15 between the Vdd line layout pattern 161 and the neighboring metal line layout pattern 162 the same as a line-to-line spacing S16 between the Vss line layout pattern 167 and the neighboring metal line layout pattern 166. In some embodiments, a ratio of the Vdd line width W14 to the Vss line width W15 is in a range from about 101.5% to about 111.5%. If the ratio of the Vdd line width W14 to the Vss line width W15 is excessively higher than the upper limit, the current of P-type FET will be excessively higher than N-type FET. If the ratio of the Vdd line width W14 to the Vss line width W15 is excessively lower than the lower limit, the asymmetric arrangement of the metal line layout patterns 162-166 may not allow for the metal line layout patterns 163 and 164 arranged between the fin group layout patterns 110 and 120 without overlapping any one of the fin layout patterns 112 and 122.

In some embodiments, because the metal line layout patterns 162-166 are shifted toward the second fin group layout pattern 120, more metal line layout patterns overlap the second fin group layout pattern 120, and less metal line layout patterns overlap the first fin group layout pattern 110. By way of example and not limitation, two of the metal line layout patterns 162-166 (e.g., metal line layout patterns 165 and 166) overlap the second fin group layout pattern 120, while one of the metal line layout patterns 162-166 (e.g., metal line layout pattern 162) overlaps the first fin group layout pattern 110. Moreover, the Vdd line width W14 is greater than the Vss line width W15, and thus an overlapping area between the Vdd line layout pattern 161 and the source/drain contact layout patterns 142 is greater than an overlapping area between the Vss line layout pattern 167 and the source/drain contact layout patterns 144. Similarly, an overlapping area between the Vdd line layout pattern 161 and the first fin layout patterns 112 is greater than an overlapping area between the Vss line layout pattern 167 and the second fin layout patterns 122. By way of example and not limitation, the Vdd line layout pattern 161 overlaps an entirety of the upper one of the first fin layout patterns 112, and the Vss line layout pattern 167 overlaps only a partial region of the lower one of the second fin layout patterns 122.

A sum of the line-to-line spacing S14 and twice the line width W13 is less than the width of fin-free region D1 between the first and second fin group layout patterns 110 and 120 (i.e., the distance between the lower one of the first fin layout patterns 112 and the upper one of the second fin layout patterns 122). This allows for the metal line layout patterns 163 and 164 non-overlapping the first and second fin group layout patterns 110 and 120. In some embodiments, the line-to-line spacing S14 of the metal line layout patterns 162-166 is the same as the line-to-line spacing S15 between the Vdd line layout pattern 161 and the neighboring metal line layout pattern 162, and the line-to-line spacing S16 between the Vss line layout pattern 167 and the neighboring metal line layout pattern 166. In some embodiments, the line-to-line spacing S14 of the metal line layout patterns 162-166 is less than the line width W13 of the metal line layout patterns 162-166, which in turn allows for a close arrangement of the metal line layout patterns 162-166.

The layout 100 further includes a gate contact layout pattern 171 overlying the gate layout pattern 133, and a gate contact layout pattern 172 overlying the gate layout pattern 132. The gate contact layout patterns 171 and 172 define corresponding gate contacts 171A and 172A (FIGS. 1B-1D) of the semiconductor device 100A. The gate contact layout pattern 171 overlaps an intersection of the gate layout pattern 133 and the metal line layout pattern 163, thus providing an electrical connection between the gate layout pattern 133 and the metal line layout pattern 163. The gate contact layout pattern 172 overlaps an intersection of the gate layout pattern 132 and the metal line layout pattern 164, thus providing an electrical connection between the gate layout pattern 132 and the metal line layout pattern 164. In this way, the gate structures 132A and 133A are electrically connected to different metal lines 164A and 163A (FIGS. 1B-1D), which in turn allows for the gate structures 132A and 133A electrically connected to different nets. Each net is a separate electrically conductive pathway between nodes or terminals of semiconductor devices that collectively forms electrical circuits. For example, a net is a separate electrically conductive portion of one or more metallization patterns (e.g., gate contacts and metal lines and vias above the gate contacts) on one or more photolithographic levels of Very large scale integration (VLSI) integrated circuits (ICs). In some embodiments, the gate contact layout patterns 171 and 172 are identified in the legend in the drawings with label "VG."

The layout 100 further includes two cut layout patterns 150 extending along the Y direction across the metal line layout patterns 162-166. The cut layout patterns 150 represent cut sections or patterning area where the metal line layout patterns 162-166 are removed for electrical disconnections according to the integrated circuit design. The cut layout patterns 150 extend along the Y direction, and thus the cut layout patterns 150 and the gate layout patterns 131-134 are parallel with each other. Moreover, the cut layout patterns 150 may overlap the gate layout patterns 131 and 134 at opposite sides of the layout 100. In some embodiments, the cut layout patterns 150 are used to indicate cut sections of M0 lines and are identified in the legend in the drawings with label "CM0."

FIGS. 1B-1D are views of a semiconductor device 100A fabricated using the layout 100 in accordance with some embodiments, and thus the semiconductor device 100A inherits geometry of those patterns in the layout 100, as described in greater detail below. FIG. 1B is a top view of the semiconductor device 100A. FIG. 1C is a cross-sectional view of the semiconductor device 100A of FIG. 1B taken along line C-C'. FIG. 1D is a cross-sectional view of the semiconductor device 100A of FIG. 1B taken along line D-D'. The semiconductor device 100A is a non-limiting example for facilitating the illustration of the present disclosure.

Referring to FIGS. 1B-1D, the semiconductor device 100A includes a substrate 102A over which various elements of the semiconductor device 100A are formed. The substrate 102A includes, but is not limited to, a bulk silicon substrate, a silicon-on-insulator (SOI) substrate, or a silicon geranium substrate. Other semiconductor materials including group III, group IV, and group V elements are within the scope of various embodiments.

The semiconductor device 100A further includes first and second fin groups 110A and 120A extending upwardly from the substrate 102A, and gate structures 131A, 132A, 133A and 134A extending along the Y direction across the fin groups 110A and 120A. The first fin group 110A includes three first fins 112A arranged at a first fin-to-fin spacing S11A, and the second fin group 120A includes three second fins 122A arranged at a second fin-to-fin spacing S12A. In some embodiments, the first fin-to-fin spacing S11A is comparable to the first fin-to-fin spacing S11 of the first fin layout patterns 112 in the layout 100, and the second fin-to-fin spacing S12A is comparable to the second fin-to-fin spacing S12 of the second fin layout patterns 122 in the layout 100. In some embodiments, the first fin-to-fin spacing S11A may be slightly different from the second fin-to-fin spacing S12A due to the nature of photolithography and etching techniques used to fabricate to fins 112A and 122A, even if the first fin-to-fin spacing S11 is set the same as the second fin-to-fin spacing S12 in the layout 100 as shown in FIG. 1A.

The first and second fins 112A and 122A may be formed by patterning the semiconductor substrate 102A using photolithography and etching techniques, and thus the resulting fins 112A and 122A are formed of semiconductor materials as well. Therefore, these fins can be interchangeably referred to as semiconductor fins in the present disclosure. For example, a spacer image transfer (SIT) patterning technique may be used to for the semiconductor fins. In this method a sacrificial layer is formed over the substrate 102A and patterned to form mandrels using suitable photolithography and etch processes. Spacers are formed alongside the mandrels using a self-aligned process. The sacrificial layer is then removed by an appropriate selective etch process. Each remaining spacer may then be used as a hard mask to pattern the respective fins 112A and 122A by etching trenches into the substrate 102A using, for example, reactive ion etching (RIE).

The fins 112A and 122A are electrically isolated from each other by an isolation structure 104A. In some embodiments, the isolation structure 104A is a shallow trench isolation (STI) structure including a trench filled with one or more dielectric material. In some embodiments, the STI structure includes silicon dioxide, silicon nitride, silicon oxynitride, or any other suitable insulating materials.

The STI structure 104A may be formed by depositing one or more dielectric materials (e.g., silicon oxide) to completely fill the trenches around the fins 112A and 122A and then recessing the top surface of the dielectric materials to fall below topmost ends of the fins 112A and 122A. The dielectric materials of the STI structure 104A may be deposited using a high density plasma chemical vapor deposition (HDP-CVD), a low-pressure CVD (LPCVD), sub-atmospheric CVD (SACVD), a flowable CVD (FCVD), spin-on, and/or the like, or a combination thereof. After the deposition, an anneal process or a curing process may be performed. In some cases, the STI structures 104A may include a liner such as, for example, a thermal oxide liner grown by oxidizing the silicon surface. The recess process may use, for example, a planarization process (e.g., a chemical mechanical polish (CMP)) followed by a selective etch process (e.g., a wet etch, or dry etch, or a combination thereof) that may recess the top surface of the dielectric materials in the STI structure 104A such that an upper portion of the first and second fins 112A and 122A protrude from surrounding insulating STI structure 104A. In some cases, the patterned hard mask used to form the first and second fins 112A and 122A may also be removed by the planarization process.

The first fins 112A and second 122A each include a plurality of source/drain regions 114A and 124A. The source/drain regions 114A and 124A are doped semiconductor regions located on opposite sides of the corresponding gate structures 131A-134A. In some embodiments, the source/drain regions 114A and 124A include p-type dopants such as boron for formation of p-type FETs. In other embodiments, the source/drain regions 114A and 124A include n-type dopants such as phosphorus for formation of n-type FETs.

In some embodiments, the source/drain regions 114A and 124A may be epitaxially grown regions. For example, gate spacers 106A may be formed alongside dummy gate structures (which will be replaced with the final gate structures 131A-134A) by depositing a spacer material and anisotropically etching the spacer material, and subsequently, the source/drain regions 114A and 124A may be formed self-aligned to the gate spacers 106A by first etching the fins 112A and 122A to form recesses, and then depositing a crystalline semiconductor material in the recess by a selective epitaxial growth (SEG) process that may fill the recesses in the fins 112A, 122A and may extend further beyond the original surface of the fins 112A, 122A to form raised source/drain epitaxy structures in some embodiments. The crystalline semiconductor material may be elemental (e.g., Si, or Ge, or the like), or an alloy (e.g., $Si_{1-x}C_x$, or $Si_{1-x}Ge_x$, or the like). The SEG process may use any suitable epitaxial growth method, such as e.g., vapor/solid/liquid phase epitaxy (VPE, SPE, LPE), or metal-organic CVD (MOCVD), or molecular beam epitaxy (MBE), or the like. A high dose (e.g., from about $10^{14}$ $cm^{-2}$ to $10^{16}$ $cm^{-2}$) of dopants may be introduced into source/drain regions 114A and 124A either in situ during SEG, or by an ion implantation process performed after the SEG, or by a combination thereof.

The gate structures 131A-134A extend along the Y direction across the first and second fins 112A and 122A. The gate structures 131A-134A are arranged at a gate-to-gate spacing S13A. The gate-to-gate spacing S13A is greater than the fin-to-fin spacings S11A and S12A. The gate-to-gate spacing S13A is comparable to the gate-to-gate spacing S13 of the gate layout patterns 131-134 in the layout 100. In some embodiments, the gate structures 131A-134A are high-k metal gate (HKMG) gate structures that may be formed using a gate-last process flow (interchangeably referred to as gate replacement flow). In a gate-last process flow a sacrificial dummy gate structure (e.g., polysilicon gate, not shown) is formed after forming the STI structure 104A. The dummy gate structure may comprise a dummy gate dielectric, a dummy gate electrode (e.g., polysilicon gate), and a hard mask. First a dummy gate dielectric material (e.g., silicon oxide, silicon nitride, or the like) may be deposited. Next a dummy gate material (e.g., polysilicon) may be deposited over the dummy gate dielectric and then planarized (e.g., by CMP). A hard mask layer (e.g., silicon nitride, silicon carbide, or the like) may be formed over the dummy gate material. The dummy gate structure is then formed by patterning the hard mask layer and transferring that pattern to the dummy gate dielectric and dummy gate material using suitable photolithography and etching techniques. The dummy gate structure may extend along multiple sides of the protruding fins 112A, 122A and extend between the fins 112A, 122A over the surface of the STI structure 104A. After forming the source/drain regions 114A, the dummy gate structure is replaced by the HKMG gate structures 131A-134A as illustrated in FIGS. 1B-1D. The materials used to form the dummy gate structure and hard mask may be deposited using any suitable method such as CVD, plasma-enhanced CVD (PECVD), atomic layer deposition (ALD), plasma-enhanced ALD (PEALD) or the like, or by thermal oxidation of the semiconductor surface, or combinations thereof.

In some embodiments, each of the HKMG gate structures 131A-134A includes a high-k gate dielectric material and one or more gate metals. Exemplary high-k gate dielectric materials include, but are not limited to, silicon nitride, silicon oxynitride, hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), metal oxides, metal nitrides, metal silicates, transition metal-oxides, transition metal-nitrides, transition metal-silicates, oxynitrides of metals, metal aluminates, zirconium silicate, zirconium aluminate, zirconium oxide, titanium oxide, aluminum oxide, hafnium dioxide-alumina ($HfO_2$—$Al_2O_3$) alloy, other suitable high-k dielectric materials, and/or combinations thereof. In some embodiments, the gate dielectric includes a stack of an interfacial dielectric material and a high-k dielectric material. In some embodiments, the interfacial dielectric material includes silicon dioxide. The gate metal(s) is formed over the gate dielectric. Exemplary gate metal(s) includes, for example, copper (Cu), aluminum (Al), titanium (Ti), titanium nitride (TiN), tantalum (Ta), tantalum nitride (TaN), tantalum carbide (TaC), tantalum silicon nitride (TaSiN), tungsten (W), tungsten nitride (WN), or molybdenum nitride (MoN).

The semiconductor device 100A further includes first source/drain contacts 142A each extending across first source/drain regions 114A of three first fins 112A, and second source/drain contacts 144A each extending across second source/drain regions 124A of three second fins 122A. In some embodiments, source/drain contacts 132A include a conductive material such as, for example, cobalt (Co), Cu, W or other suitable metals. Formation of the source/drain contacts 142A and 144A includes, for example, etching source/drain contact openings in a first interlayer dielectric (ILD) layer (not shown) over the fins 112A, 122A after forming the HKMG gate structures 131A-134A, depositing one or more conductive materials in the source/drain contact openings, and performing a CMP process to planarize the one or more conductive materials with the gate structures 131A-134A.

The semiconductor device 100A further includes gate contacts 171A and 172A over the corresponding gate structures 133A and 132A, respectively. In some embodiments, gate contacts 171A and 172A include a conductive material such as, for example, cobalt (Co), Cu, W or other suitable metals. Formation of the gate contacts 171A and 172A includes, for example, etching gate contact openings in a second interlayer dielectric (ILD) layer (which is deposited over the first ILD layer after forming the source/drain contacts 142A and 144A) over the gate structures 131A-134A, depositing one or more conductive materials in the gate contact openings, and planarizing the one or more conducitve materials by using, for example, a CMP process.

The semiconductor device 100A further includes a plurality of metal lines 161A, 162A, 163A, 164A, 165A, 166A and 167A on a next level above the gate contacts 171A and 172A. The metal lines 161A-167A extend along the X direction perpendicular to the Y direction along which the gate structures 131A-134A and source/drain contacts 142A and 144A extend. The uppermost metal line 161A shown in FIG. 1B is a Vdd line, and the lowermost metal line 167A as shown in FIG. 1B is a Vss line. The Vdd line 161A is electrically connected to a Vdd voltage (e.g., positive voltage), and the Vss line 167A is electrically connected to a Vss voltage (e.g., electrical ground or a negative voltage). The metal lines 162A-166A are arranged between the Vdd line 161A and the Vss line 167A and may be connected to different voltages than the Vdd line 161A and the Vss line 167A.

In some embodiments, metal lines 161A-167A include a conductive material such as, for example, cobalt (Co), Cu, W or other suitable metals. Formation of the metal lines 161A-167A includes, for example, etching trenches in a third interlayer dielectric (ILD) layer (which is formed over the second ILD layer, not shown) over the gate contacts 171A and 172A, depositing one or more conductive materials in the trenches, and performing a CMP process to planarize the one or more conductive materials. Afterwards, the metal lines 162A-166A are patterned using the cut layout patterns 150 in the layout 100. For example, a photoresist is first coated on the semiconductor device 100A and then patterned using the cut layout patterns 150 in the layout 100, and subsequently, the metal lines 162A-166A are patterned by an etching process using the patterned photoresist as a etch mask. As a result of the etching process, each of the metal lines 162-166A is broken into discontinuous metal lines, as illustrated in FIG. 1B.

Each of the metal lines 162A-166A is separated from an adjacent one of the metal lines 162A-166A in the Y direction by a line-to-line spacing S14A, and each of the metal lines 162A-166A has a line width W13A measured in the Y direction. The line-to-line spacing S14A is comparable to the line-to-line spacing S14 of the metal line layout patterns 162-166 in the layout 100, and the line width W13A is comparable to the line width W13 of the metal line layout patterns 162-166 in the layout 100. In some embodiments, because of the nature of photolithography and etching techniques used to fabricate to the metal lines 162A-166A, the line-to-line spacings S14A may be slightly different from each other, and the line widths W13A may be slightly different from each other as well.

The metal lines 162A-166A are shifted and thus arranged in an asymmetric manner with respect to the fin groups 110A and 120A. In greater detail, the first and second fin groups 110A and 120A are symmetric about a symmetric axis A extending in the X direction, but the metal lines 162A-166A are asymmetric about the symmetric axis A of the fin groups 110A and 120A. The asymmetric arrangement of the metal lines 162A-166A allows for the metal lines 163A and 164A arranged between the fin groups 110A and 120A and overlapping none of the fins 112A and 122A.

The Vdd line 161A has a Vdd line width W14A and the Vss line 167A has a Vss line width W15A in the Y direction. The Vdd line width W14A is comparable to the Vdd line width W14 in the layout 100, and the Vss line width W15A is comparable to the Vss line width W15 in the layout 100. In the depicted embodiments in FIG. 1B, the Vdd line width W14A is greater than the Vss line width W15A, which in turn allows for shifting the metal lines 162A-166A toward the second fin group 120, while keeping a line-to-line spacing S15A between the Vdd line 161A and the neighboring metal line 162A comparable to a line-to-line spacing S16A between the Vss line 167A and the neighboring metal line 166A. In some embodiments, the line-to-line spacing S15A may be slightly different from the line-to-line spacing S16A due to the nature of photolithography and etching processes used to fabricate the metal lines 161A-167A. In some embodiments, a ratio of the Vdd line width W14A to the Vss line width W15A is in a range from about 101.5% to about 111.5%. If the ratio of the Vdd line width W14A to the Vss line width W15A is excessively higher than the upper limit, the current of the P-type FET will be excessively higher than the N-type FET. If the ratio of the Vdd line width W14A to the Vss line width W15A is excessively lower than the lower limit, the asymmetric arrangement of the metal lines may not allow for the metal lines 163A and 134A arranged between the fin groups 110 and 120 without overlapping any one of the fins 112A and 122A.

A sum of the line-to-line spacing S14A and twice the line width W13A is less than the width of fin-free region D1A between the first and second fin groups 110A and 120A (i.e., the distance between the lower one of the first fins 112A and the upper one of the second fins 122A). This allows for the metal lines 163A and 164A non-overlapping the first and second fin groups 110A and 120A.

Figure 2A:
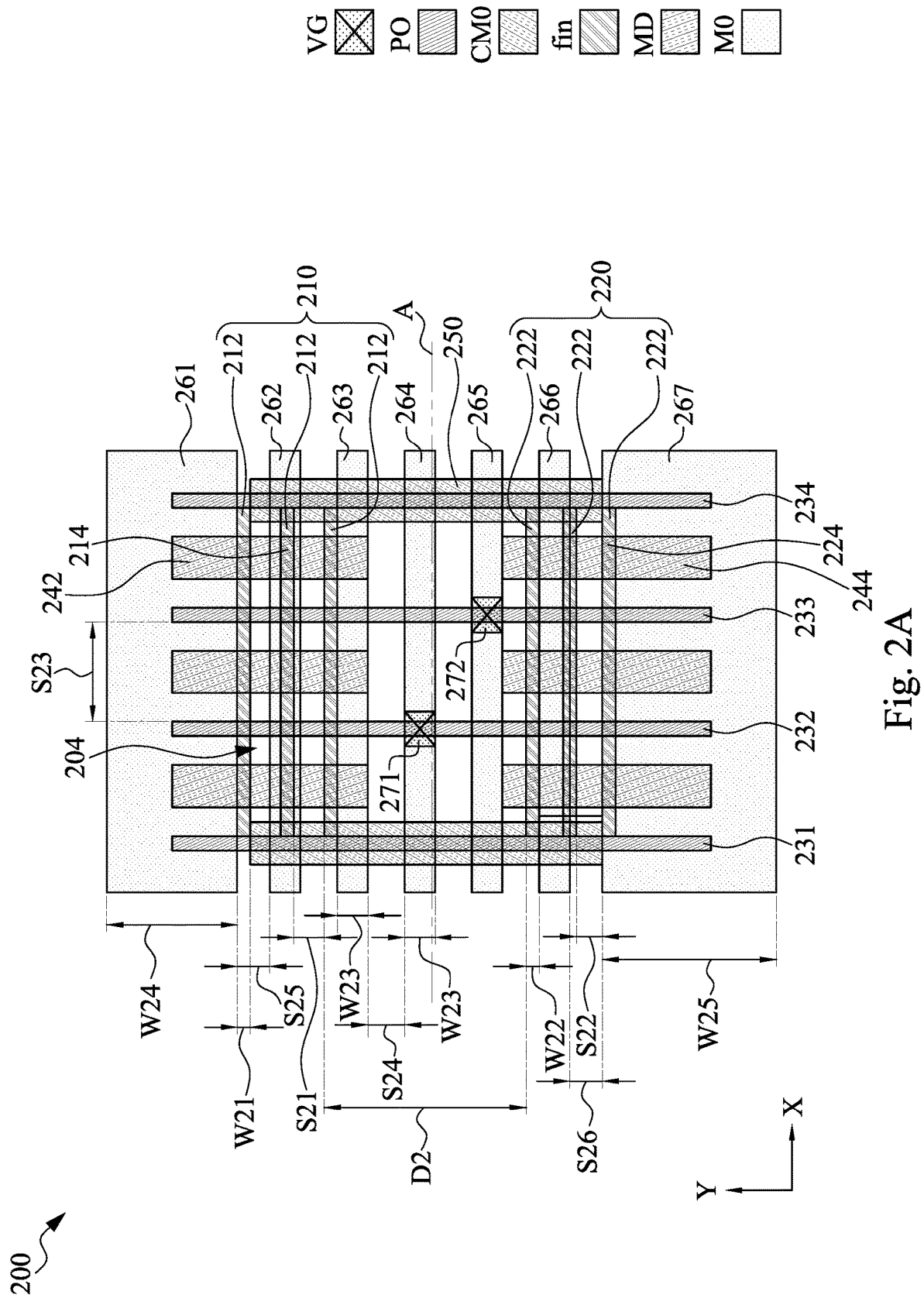
FIG. 2A is a diagram of a layout of a semiconductor device, in accordance with some embodiments.
Figure 2B:
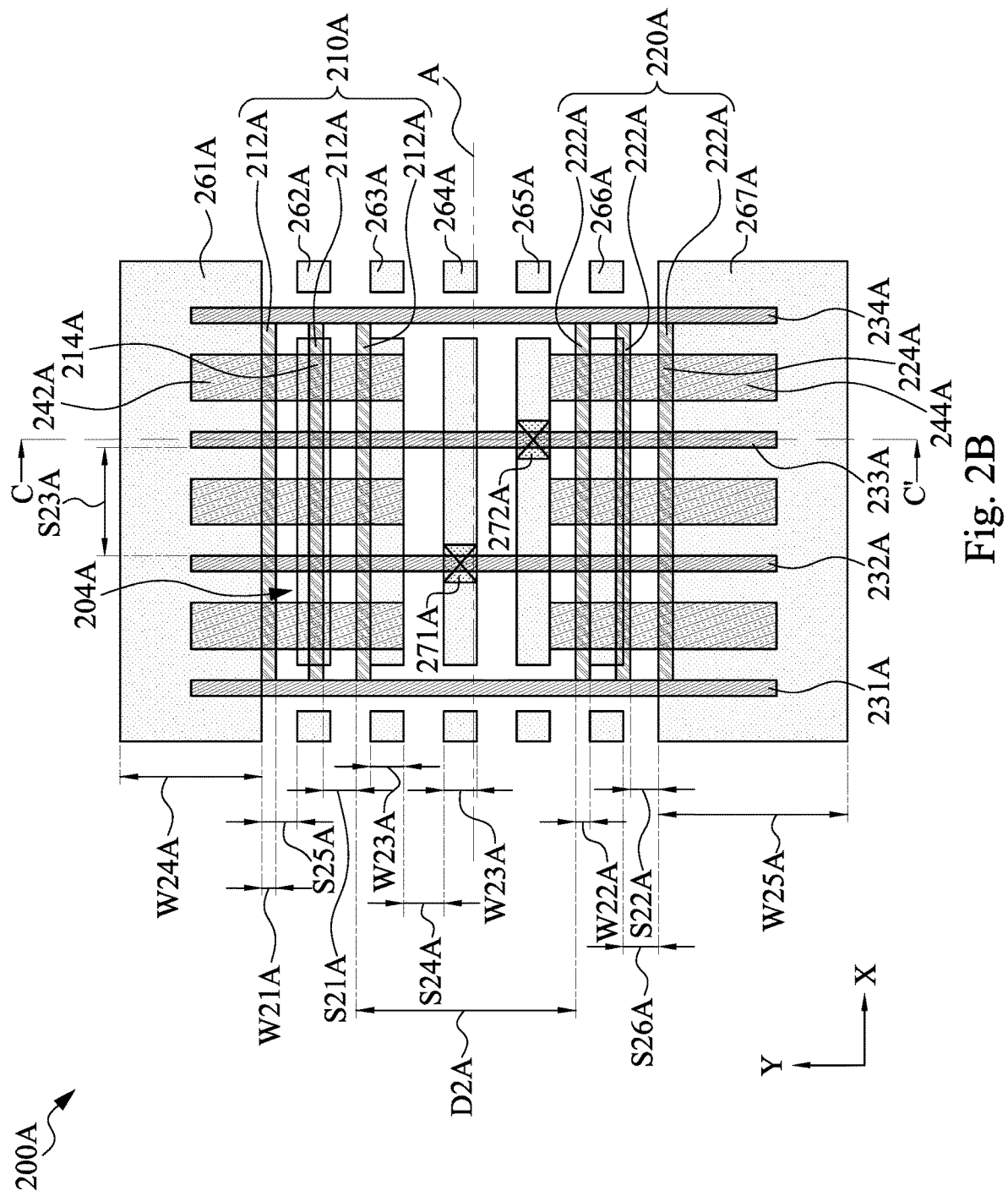
FIGS. 2B-2C are views of a semiconductor device fabricated using the layout of FIG. 2A, in accordance with some embodiments.
Figure 2C:
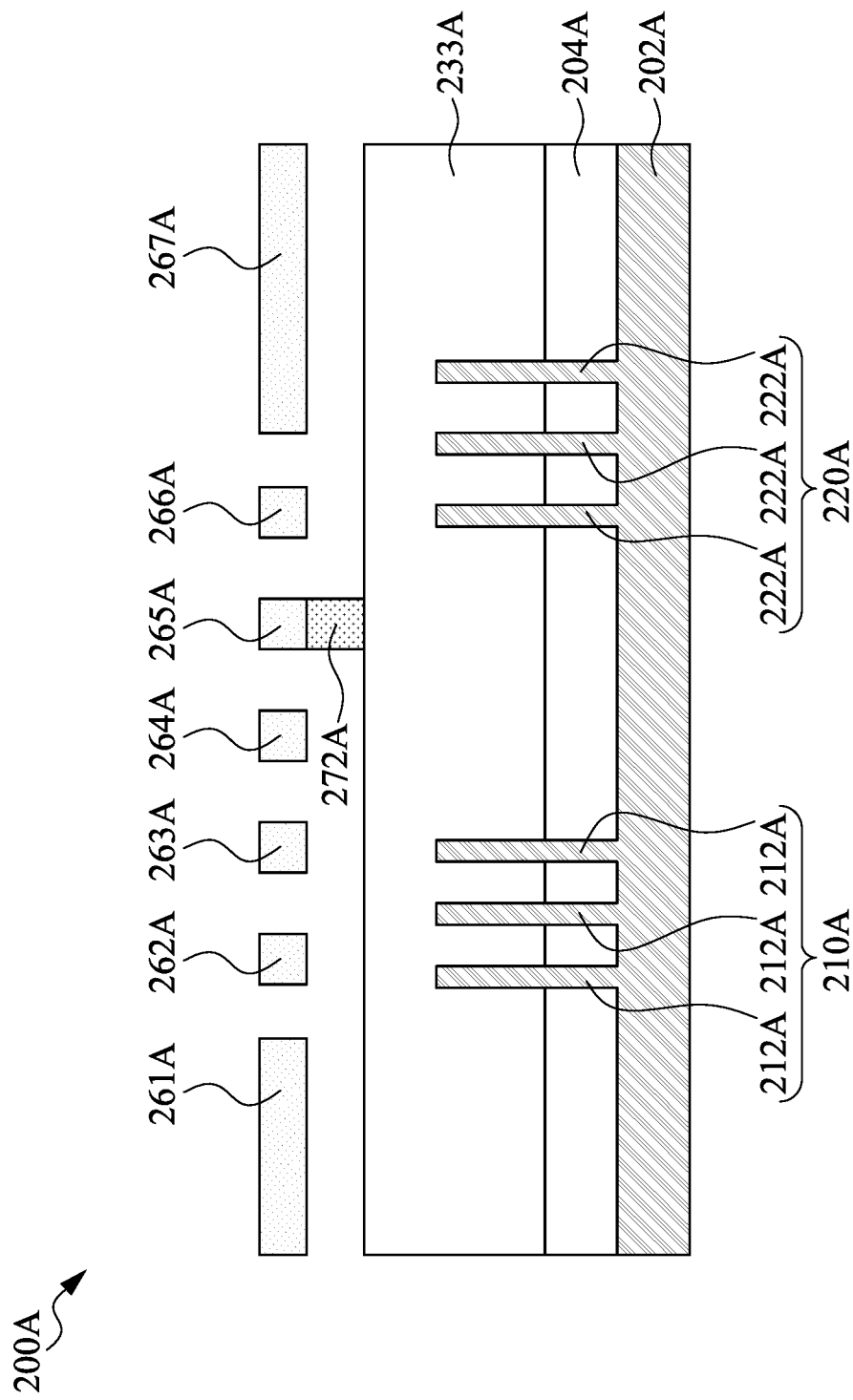

FIG. 2A is a diagram of a layout 200 of a semiconductor device, in accordance with some other embodiments. The layout 200 is usable to manufacture a semiconductor device 200A as illustrated in FIGS. 2B-2C. The layout 200 is substantially the same as the layout 100, except that the Vss line width is greater than the Vdd line width, as described in greater detail below. The same or similar configurations as described with FIGS. 1A-1D may be employed in the following embodiments, and the detailed explanation may be omitted.

Referring to FIG. 2A, the layout 200 includes first and second fin group layout patterns 210 and 220. The first and second fin group layout patterns 210 and 220 define corresponding first and second fin groups 210A and 220B (FIGS. 2B-2C) of the semiconductor device 200A. The first fin group layout pattern 210 includes three first fin layout patterns 212 extending along the X direction and spaced apart from each other along the Y direction. Each first fin layout pattern 212 is separated from an adjacent first fin layout pattern 212 in the Y direction by a first fin-to-fin spacing S21, and each first fin layout pattern 212 has a first fin width W21 measured in the Y direction. Similarly, the second fin group layout pattern 220 includes three second fin layout patterns 222 extending along the X direction and spaced apart from each other along Y direction. Each second fin layout pattern 222 is separated from an adjacent second fin layout pattern 222 in the Y direction by a second fin-to-fin spacing S22, and each second fin layout pattern 222 has a second fin width W22 measured in the Y direction. The first fin group layout pattern 210 is separated from the second fin group layout pattern 220 in the Y direction by a fin-free region D2, which is larger than the first and second fin-to-fin spacings S21 and S22. The first fin-to-fin spacing S21 of the first fin layout patterns 212 may be the same as or different from the second fin-to-fin spacing S22 of the second fin layout patterns 222. The first fin width W21 of the first fin layout patterns 212 is the same as or different from the second fin width W22 of the second fin layout patterns 222. The first and second fin layout patterns 212 and 222 define corresponding first and second fins 212A and 222A (FIGS. 2B-2C) of the semiconductor device 200A.

The first fin layout patterns 212 each include first source/drain region layout patterns 214 that define corresponding first source/drain regions 214A (FIGS. 2B-2C) of the semiconductor device 200A. Similarly, the second fin layout patterns 222 each include second source/drain region layout patterns 224 that define corresponding second source/drain regions 224A (FIGS. 2B-2C) of the semiconductor device 200A. The fin layout patterns 212 and 222 are separated from each other and other components of the layout 200 on the same layout level by an isolation structure layout pattern 204. The isolation structure layout pattern 204 defines a corresponding isolation structure 204A (FIGS. 2B-2C) of the semiconductor device 200A.

The layout 200 further includes a plurality of gate layout patterns 231, 232, 233 and 234 extending along the Y direction across the fin group layout patterns 210 and 220. The gate layout patterns 231-234 define corresponding gate structures 231A, 232A, 233A and 234A (FIGS. 2B-2C) of the semiconductor device 200A. Each of the gate layout patterns 231-234 is separated from an adjacent one of the gate layout patterns 231-234 in the X direction by a gate-to-gate spacing S23. The gate-to-gate spacing S23 is greater than the fin-to-fin spacings S21 and S22. The gate layout patterns 231-234 and corresponding source/drain region layout patterns 214 and 224 on opposite sides of the gate layout patterns 231-234 form a plurality of FETs.

The layout 200 includes a plurality of first source/drain contact layout patterns 242 extending along the Y direction across the first source/drain region layout patterns 214 of three first fins layout patterns 212, and thus the three first fin layout patterns 212 share common source/drain contact layout patterns 242. Similarly, the layout 200 further includes a plurality of second source/drain contact layout patterns 244 extending along the Y direction across the second source/drain region layout patterns 224 of three second fins layout patterns 222, and thus the three second fin layout patterns 222 share common source/drain contact layout patterns 244. The source/drain contact layout patterns 242 and 244 define corresponding source/drain contacts 242A and 244A of the semiconductor device 200A (FIGS. 2B-2C).

The layout 200 further includes a plurality of metal line layout patterns 261, 262, 263, 264, 265, 266 and 267 extending along the X direction and spaced apart from each other along the Y direction. The metal line layout patterns 261-267 define corresponding metal lines 261A-267A (FIGS. 2B-2C) of the semiconductor device 200A.

The metal line layout pattern 261 at an upper boundary of the layout 200 is a Vdd line layout pattern, and the metal line layout pattern 267 at a lower boundary of the layout 200 is a Vss line layout pattern. The metal line layout patterns 262-266 are arranged between the Vdd line layout pattern 261 and the Vss line layout pattern 267. Each of the metal line layout patterns 262-266 is separated from an adjacent one of the metal line layout patterns 262-266 in the Y direction by a line-to-line spacing S24, and each of the metal line layout patterns 262-266 has a line width W23 measured in the Y direction. In some embodiments, the line width W23 of the metal line layout patterns 262-266 is greater than the fin widths W21 and W22 of the first and second fin layout patterns 212 and 222.

The metal line layout patterns 262-266 are shifted and thus arranged in an asymmetric manner with respect to the fin group layout patterns 210 and 220. In greater detail, the first and second fin group layout patterns 210 and 220 are symmetric about a symmetric axis A extending in the X direction, and the metal line layout patterns 262-266 are asymmetric about the symmetric axis A of the fin group layout patterns 210 and 220. The asymmetric arrangement of the metal line layout patterns 262-266 allows for the metal line layout patterns 264 and 265 arranged between the fin group layout patterns 210 and 220 without overlapping any one of the fin layout patterns 212 and 222.

The Vdd line layout pattern 261 has a Vdd line width W24 and the Vss line layout pattern 267 has a Vss line width W25 in the Y direction. In the depicted embodiments in FIG. 2A, the Vss line width W25 is greater than the Vdd line width W24, which in turn allows for shifting the metal line layout patterns 262-266 toward the first fin group layout pattern 210, while keeping a line-to-line spacing S25 between the Vdd line layout pattern 261 and the neighboring metal line layout pattern 262 the same as a line-to-line spacing S26 between the Vss line layout pattern 267 and the neighboring metal line layout pattern 266. In some embodiments, a ratio of the Vss line width W25 to the Vdd line width W24 is in a range from about 101.5% to about 111.5%. If the ratio of the Vss line width W25 to the Vdd line width W24 is excessively higher than the upper limit, the current of N-type FET will excessively higher than P-type FET. If the ratio of the Vss line width W25 to the Vdd line width W24 is excessively lower than the lower limit, the asymmetric arrangement of the metal line layout patterns 262-266 may not allow for the metal line layout patterns 264 and 265 arranged between the fin group layout patterns 210 and 220 without overlapping any one of the fin layout patterns 212 and 222.

In some embodiments, because the Vdd line width W24 is less than the Vss line width W25, an overlapping area between the Vdd line layout pattern 261 and the source/drain contact layout patterns 242 is less than an overlapping area between the Vss line layout pattern 267 and the source/drain contact layout patterns 244. Similarly, an overlapping area between the Vdd line layout pattern 261 and the first fin layout patterns 212 is less than an overlapping area between the Vss line layout pattern 267 and the second fin layout patterns 222. By way of example and not limitation, the Vss line layout pattern 267 overlaps an entirety of the lower one of the second fin layout patterns 222, and the Vdd line layout pattern 261 overlaps only a partial region of the upper one of the first fin layout patterns 212.

A sum of the line-to-line spacing S24 and twice the line width W23 is less than the width of fin-free region D2 between the first and second fin group layout patterns 210 and 220 (i.e., the distance between the lower one of the first fin layout patterns 212 and the upper one of the second fin layout patterns 222). This allows for the metal line layout patterns 264 and 165 non-overlapping the first and second fin group layout patterns 210 and 220. In some embodiments, the line-to-line spacing S24 of the metal line layout patterns 262-266 is the same as the line-to-line spacing S25 between the Vdd line layout pattern 261 and the neighboring metal line layout pattern 262, and the line-to-line spacing S26 between the Vss line layout pattern 267 and the neighboring metal line layout pattern 266. In some embodiments, the line-to-line spacing S24 of the metal line layout patterns 262-266 is less than the line width W23 of the metal line layout patterns 262-266, which in turn allows for a close arrangement of the metal line layout patterns 262-266.

The layout 200 further includes gate contact layout patterns 271 and 272 overlying the corresponding gate layout patterns 232 and 233, respectively. The gate contact layout patterns 271 and 272 define corresponding gate contacts 271A and 272A (FIGS. 2B-2C) of the semiconductor device 200A. The gate contact layout pattern 271 overlaps an intersection of the gate layout pattern 232 and the metal line layout pattern 264, thus providing an electrical connection between the gate layout pattern 232 and the metal line layout pattern 264. The gate contact layout pattern 272 overlaps an intersection of the gate layout pattern 233 and the metal line layout pattern 265, thus providing an electrical connection between the gate layout pattern 233 and the metal line layout pattern 265. In this way, the gate structures 232A and 233A are electrically connected to different metal lines 264A and 265A (FIGS. 2B-2C), which in turn allows for the gate structures 232A and 233A electrically connected to different nets.

The layout 200 further includes two cut layout patterns 250 extending along the Y direction across the metal line layout patterns 262-266. The cut layout patterns 250 represent cut sections or patterning area where the metal line layout patterns 262-266 are removed for electrical disconnections according to the integrated circuit design.

FIGS. 2B and 2C are views of a semiconductor device 200A fabricated using the layout 200 in accordance with some embodiments, and thus the semiconductor device 200A inherits geometry of those patterns in the layout 200, as described in greater detail below. FIG. 2B is a top view of the semiconductor device 200A. FIG. 2C is a cross-sectional view of the semiconductor device 200A of FIG. 2B taken along line C-C'. The semiconductor device 200A is a non-limiting example for facilitating the illustration of the present disclosure.

Referring to FIGS. 2B and 2C, the semiconductor device 200A includes a substrate 202A, first and second fin groups 210A and 220A extending upwardly from the substrate 202A, and gate structures 231A, 232A, 233A and 234A extending along the Y direction across the fin groups 210A and 220A. The first fin group 210A includes three first fins 212A arranged at a first fin-to-fin spacing S21A, and the second fin group 220A includes three second fins 222A arranged at a second fin-to-fin spacing S22A. In some embodiments, the first fin-to-fin spacing S21A is comparable to the first fin-to-fin spacing S21 of the first fin layout patterns 212 in the layout 200, and the second fin-to-fin spacing S22A is comparable to the second fin-to-fin spacing S22 of the second fin layout patterns 222 in the layout 200. In some embodiments, the first fin-to-fin spacing S21A may be slightly different from the second fin-to-fin spacing S22A due to the nature of photolithography and etching techniques used to fabricate to fins 212A and 222A. Example materials and fabrication methods of the substrate 202A, the fins 212A, 222A and the gate structures 231A-234A are similar to that as shown in FIGS. 1B-1D, and thus are not repeated for the sake of brevity.

The fins 212A and 222A are electrically isolated from each other by an isolation structure 204A. In some embodiments, the isolation structure 204A is a shallow trench isolation (STI) structure including a trench filled with one or more dielectric material. Example materials and fabrication methods of the STI structure 204A are similar to the description with respect to the STI structure 104A as shown in FIGS. 1B-1D, and thus are not repeated for the sake of brevity.

The fins 212A and 222A include a plurality of source/drain regions 214A and 224A. The source/drain regions 214A and 224A are doped semiconductor regions located on opposite sides of the corresponding gate structures 231A-234A. In some embodiments, the source/drain regions 214A and 224A include p-type dopants such as boron for formation of p-type FETs. In other embodiments, the source/drain regions 214A and 224A include n-type dopants such as phosphorus for formation of n-type FETs. Example fabrication methods of the source/drain regions 214A and 224A are similar to the description with respect to the source/drain regions 114A and 124A as illustrated in FIGS. 1B-1D, and thus are not repeated for the sake of brevity.

The gate structures 231A-234A extend along the Y direction across the first and second fins 212A and 222A. The gate structures 231A-234A are arranged at a gate-to-gate spacing S23A. The gate-to-gate spacing S23A is greater than the fin-to-fin spacings S21A and S22A. The gate-to-gate spacing S23A is comparable to the gate-to-gate spacing S23 of the gate layout patterns 231-234 in the layout 200. In some embodiments, the gate structures 231A-234A are high-k metal gate (HKMG) gate structures that may be formed using a gate-last process flow, as described previously with respect to the gate structures 131A-134A as illustrated in FIGS. 1B-1D. Example materials and fabrication methods of the HKMG gate structures thus are not repeated for the sake of brevity.

The semiconductor device 200A further includes first source/drain contacts 242A each extending across first source/drain regions 214A of three first fins 212A, and second source/drain contacts 244A each extending across second source/drain regions 224A of three second fins 222A. The semiconductor device 200A further includes gate contacts 271A and 272A over the corresponding gate structures 232A and 233A, respectively. Example materials and fabrication methods of the source/drain contacts 242A, 244A and gate contacts 271A, 272A are similar to the description with respect to the source/drain contacts 142A, 144A and gate contacts 171A, 172A as illustrated in FIGS. 1B-1D, and thus are not repeated for the sake of brevity.

The semiconductor device 200A further includes a plurality of metal lines 261A, 262A, 263A, 264A, 265A, 266A and 267A on a next level above the gate contacts 271A and 272A. The metal lines 261A-267A extend along the X direction perpendicular to the Y direction along which the gate structures 231A-234A and source/drain contacts 242A and 244A extend. The uppermost metal line 261A shown in FIG. 2B is a Vdd line, and the lowermost metal line 267A as shown in FIG. 2B is a Vss line. The Vdd line 261A is electrically connected to a Vdd voltage (e.g., positive voltage), and the Vss line 267A is electrically connected to a Vss voltage (e.g., electrical ground or a negative voltage). The metal lines 262A-266A are arranged between the Vdd line 261A and the Vss line 267A and may be connected to different voltages than the Vdd line 261A and the Vss line 267A. Example materials and fabrication methods of the metal lines 261A-267A are similar to the description with respect to the metal lines 161A-167A as illustrated in FIGS. 1B-1D, and thus are not repeated for the sake of brevity.

Each of the metal lines 262A-266A is separated from an adjacent one of the metal lines 262A-266A in the Y direction by a line-to-line spacing S24A, and each of the metal lines 262A-266A has a line width W23A measured in the Y direction. The line-to-line spacing S24A is comparable to the line-to-line spacing S24 of the metal line layout patterns 262-266 in the layout 200, and the line width W23A is comparable to the line width W23 of the metal line layout patterns 262-266 in the layout 200. In some embodiments, because of the nature of photolithography and etching techniques used to fabricate to the metal lines 262A-266A, the line-to-line spacings S24A may be slightly different, and the line widths W23A may be slightly different as well.

The metal lines 262A-266A are shifted and thus arranged in an asymmetric manner with respect to the fin groups 210A and 220A. In greater detail, the first and second fin groups 210A and 220A are symmetric about a symmetric axis A extending in the X direction, and the metal lines 262A-266A are asymmetric about the symmetric axis AA of the fin groups 210A and 220A. The asymmetric arrangement of the metal lines 262A-266A allows for the metal lines 264A and 265A arranged between the fin groups 210A and 220A and overlapping none of the fins 212A and 222A.

The Vdd line 261A has a Vdd line width W24A and the Vss line 267A has a Vss line width W25A in the Y direction.

The Vdd line width W24A is comparable to the Vdd line width W24 in the layout 200, and the Vss line width W25A is comparable to the Vss line width W25 in the layout 200. In the depicted embodiments in FIG. 2B, the Vss line width W25A is greater than the Vdd line width W24A, which in turn allows for shifting the metal lines 262A-266A toward the first fin group 210A, while keeping a line-to-line spacing S25A between the Vdd line 261A and the neighboring metal line 262A comparable to a line-to-line spacing S26A between the Vss line 267A and the neighboring metal line 266A. In some embodiments, the line-to-line spacing S25A may be slightly different from the line-to-line spacing S26A due to the nature of photolithography and etching processes used to fabricate the metal lines 261A-267A. In some embodiments, a ratio of the Vss line width W25A to the Vdd line width W24A is in a range from about 101.5% to about 111.5%. If the ratio of the Vss line width W25A to the Vdd line width W24A is excessively higher than the upper limit, the current of N-type FET will be excessively higher than P-type FET. If the ratio of the Vss line width W25A to the Vdd line width W24A is excessively lower than the lower limit, the asymmetric arrangement of the metal lines 264A and 265A arranged between the fin groups 210A and 220A without overlapping any out of the fins 212A and 222A.

A sum of the line-to-line spacing S24A and twice the line width W23A is less than the width of fin-free region D2A between the first and second fin groups 210A and 220A (i.e., the distance between the lower one of the first fins 212A and the upper one of the second fins 222A). This allows the metal lines 264A and 265A non-overlapping the first and second fin groups 110A and 120A.

Figure 3A:
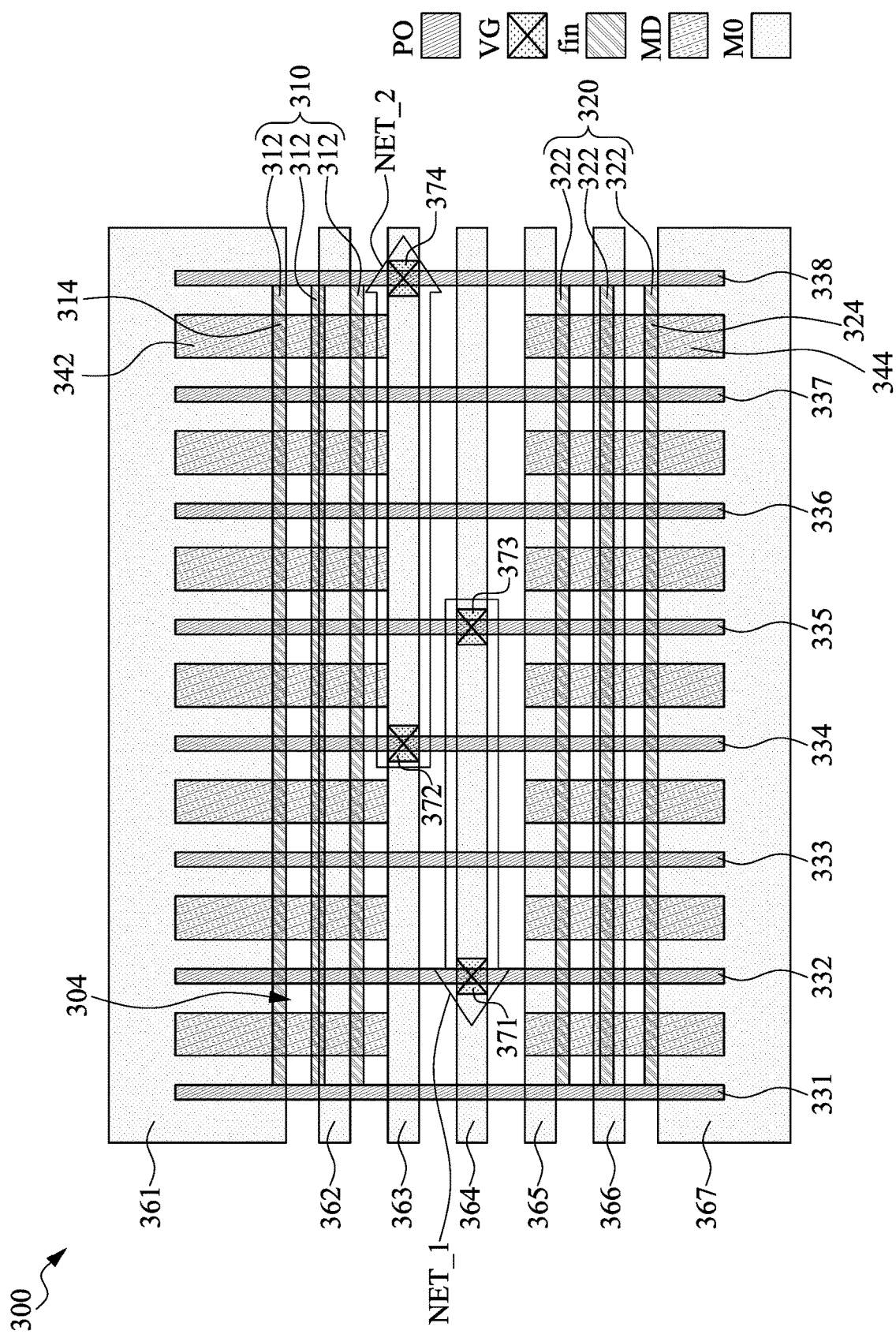
FIG. 3A is a diagram of a layout of a semiconductor device, in accordance with some embodiments.
Figure 3B:
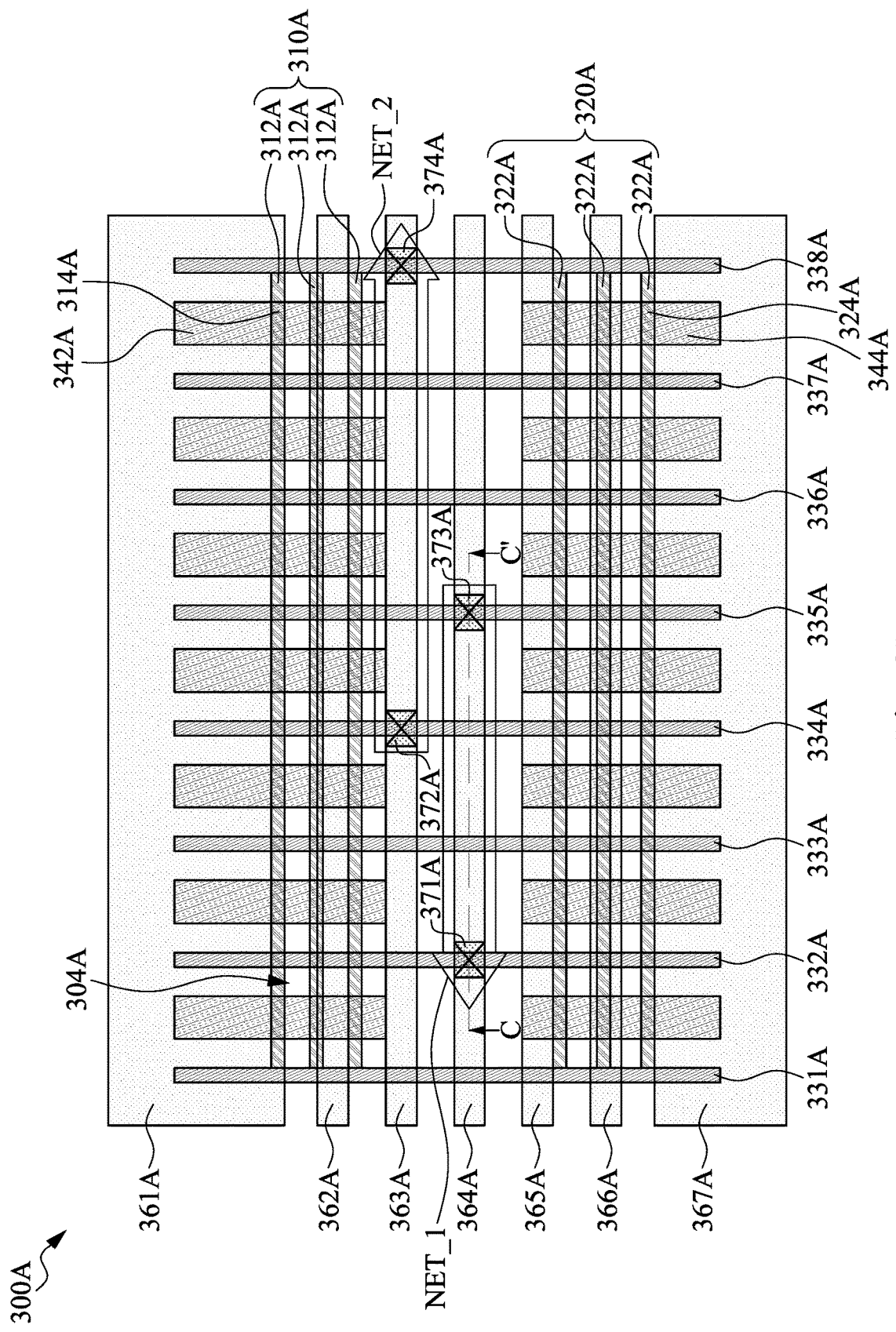
FIGS. 3B-3C are views of a semiconductor device fabricated using the layout of FIG. 3A, in accordance with some embodiments.
Figure 3C:
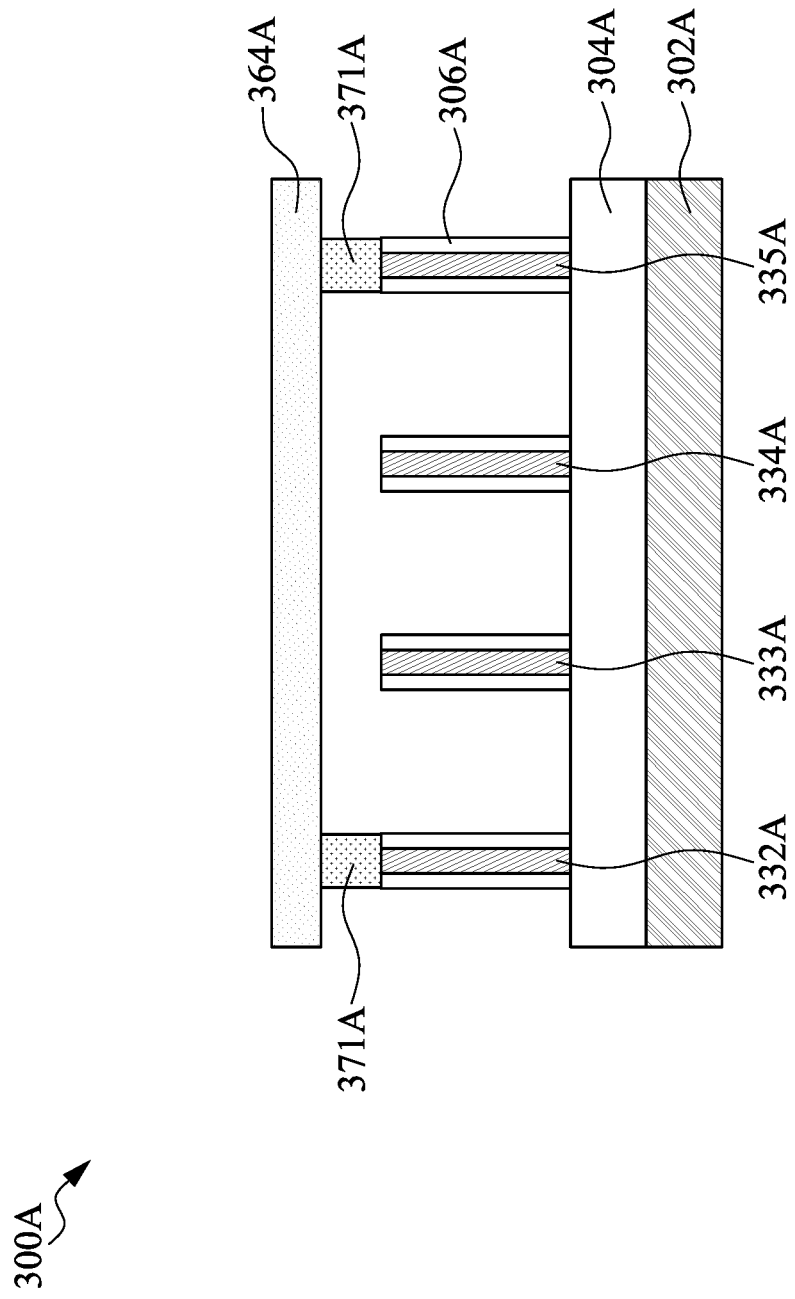

FIG. 3A is a diagram of a layout 300 of a semiconductor device, in accordance with some other embodiments. The layout 300 is usable to manufacture a semiconductor device 300A as illustrated in FIGS. 3B-3C. The layout 300 illustrates different nets NET_1 and NET_2 formed using two neighboring M0 metal lines. The nets NET_1 and NET_2 are different nets and thus not electrically connected. Therefore, the nets NET_1 and NET_2 may be electrically connected to different voltages. The same or similar configurations as described with FIGS. 1A-1D may be employed in the following embodiments, and the detailed explanation may be omitted.

Referring to FIG. 3A, the layout 300 includes first and second fin group layout patterns 310 and 320. The first and second fin group layout patterns 310 and 320 define corresponding first and second fin group regions 310A and 320A (FIGS. 3B-3C) of the semiconductor device 300A. The first fin group layout pattern 310 includes three first fin layout patterns 312 extending along the X direction and spaced apart from each other along the Y direction, and the second fin group layout pattern 320 includes three second fin layout patterns 322 extending along the X direction and spaced apart from each other along Y direction.

The first fin layout patterns 312 each include first source/drain region layout patterns 314 that define corresponding first source/drain regions 314A (FIGS. 3B-3C) of the semiconductor device 300A. Similarly, the second fin layout patterns 322 each include second source/drain region layout patterns 324 that define corresponding second source/drain regions 324A (FIGS. 3B-3C) of the semiconductor device 300A. The fin layout patterns 312 and 322 are separated from each other and other components of the layout 300 on the same layout level by an isolation structure layout pattern 304. The isolation structure layout pattern 304 defines a corresponding isolation structure 304A (FIGS. 3B-3C) of the semiconductor device 300A.

The layout 300 further includes a plurality of gate layout patterns 331, 332, 333, 334, 335, 336, 337 and 338 extending along the Y direction across the fin group layout patterns 310 and 320. The gate layout patterns 331-338 define corresponding gate structures 331A, 332A, 333A, 334A, 335A, 336A, 337A and 338A (FIGS. 3B-3C) of the semiconductor device 300A. The gate layout patterns 331-338 and corresponding source/drain region layout patterns 314 and 324 on opposite sides of the gate layout patterns 331-338 form a plurality of FETs.

The layout 300 includes a plurality of first source/drain contact layout patterns 342 extending along the Y direction across the first source/drain region layout patterns 314 of three first fins layout patterns 312, and thus the three first fin layout patterns 312 share common source/drain contact layout patterns 342. Similarly, the layout 300 further includes a plurality of second source/drain contact layout patterns 344 extending along the Y direction across the second source/drain region layout patterns 324 of three second fins layout patterns 322, and thus the three second fin layout patterns 322 share common source/drain contact layout patterns 344. The source/drain contact layout patterns 342 and 344 define corresponding source/drain contacts 342A and 344A of the semiconductor device 300A (FIGS. 3B-3C).

The layout 300 further includes a plurality of metal line layout patterns 361, 362, 363, 364, 365, 366 and 367 extending along the X direction and spaced apart from each other along the Y direction. The metal line layout patterns 361-367 define corresponding metal lines 361A-367A (FIGS. 3B-3C) of the semiconductor device 300A. The metal line layout pattern 361 at an upper boundary of the layout 300 is a Vdd line layout pattern, and the metal line layout pattern 367 at a lower boundary of the layout 300 is a Vss line layout pattern. The metal line layout patterns 362-366 are arranged between the Vdd line layout pattern 361 and the Vss line layout pattern 367.

The metal line layout patterns 361-367 are shifted and thus arranged in an asymmetric manner with respect to the fin group layout patterns 310 and 320. For example, the Vdd line layout pattern 361 overlaps an entirety of a first fin layout pattern 312, but the Vss line layout pattern 367 overlaps only a part of a second fin layout pattern 322 (e.g., a longitudinal side of the second fin layout pattern 322). The asymmetric arrangement of the metal line layout patterns 361-367 allows for the metal line layout patterns 363 and 364 arranged between the fin group layout patterns 310 and 320 without overlapping any one of the fin layout patterns 312 and 322.

The layout 300 further includes gate contact layout patterns 371, 372, 373 and 374 overlying the corresponding gate layout patterns 332, 334, 335 and 338, respectively. The gate contact layout patterns 371-374 define corresponding gate contacts 371A, 372A, 373A and 374A (FIGS. 3B-3C) of the semiconductor device 300A.

The gate contact layout pattern 371 overlaps an intersection of the gate layout pattern 332 and the metal line layout pattern 364, thus providing an electrical connection between the gate layout pattern 332 and the metal line layout pattern 364. The gate contact layout pattern 372 overlaps an intersection of the gate layout pattern 334 and the metal line layout pattern 363, thus providing an electrical connection between the gate layout pattern 334 and the metal line layout pattern 363. The gate contact layout pattern 373 overlaps an intersection of the gate layout pattern 335 and the metal line layout pattern 364, thus providing an electrical connection between the gate layout pattern 335 and the metal line layout pattern 364. The gate contact layout pattern 374 overlaps an intersection of the gate layout pattern 338 and the metal line layout pattern 363, thus providing an electrical connection between the gate layout pattern 338 and the metal line layout pattern 363. The metal line layout patterns 363 and 364 are not electrically connected to each other. In this way, the gate layout patterns 332 and 335 can be electrically connected to a first net NET_1 by using the metal line layout pattern 364, and the gate layout patterns 334 and 338 can be electrically connected to a second net NET_2 different from the first net NET_1 by using the metal line layout pattern 363. As a result, different nets NET_1 and NET_2 can be achieved by using two M0 lines, which in turn saves routing resources and improves routing flexibility.

FIGS. 3B and 3C are views of a semiconductor device 300A fabricated using the layout 300 in accordance with some embodiments, and thus the semiconductor device 300A inherits geometry of those patterns in the layout 300, as described in greater detail below. FIG. 3B is a top view of the semiconductor device 300A. FIG. 3C is a cross-sectional view of the semiconductor device 300A of FIG. 3B taken along line C-C'. The semiconductor device 300A is a non-limiting example for facilitating the illustration of the present disclosure.

Referring to FIGS. 3B and 3C, the semiconductor device 300A includes a substrate 302A, first and second fin groups 310A and 320A extending upwardly from the substrate 302A, and gate structures 331A, 332A, 333A, 334A, 335A, 336A, 337A and 338A extending along the Y direction across the fin groups 310A and 320A. The first fin group 310A includes three first fins 312A arranged at intervals, and the second fin group 310A includes three second fins 322A arranged at intervals. Example materials and fabrication methods of the substrate 302A, the fins 312A, 322A and the gate structures 331A-334A are similar to that as shown in FIGS. 1B-1D, and thus are not repeated for the sake of brevity.

The fins 312A and 322A are electrically isolated from each other by an isolation structure 304A. In some embodiments, the isolation structure 304A is a shallow trench isolation (STI) structure including a trench filled with one or more dielectric material. Example materials and fabrication methods of the STI structure 304A are similar to the description with respect to the STI structure 104A as shown in FIGS. 1B-1D, and thus are not repeated for the sake of brevity.

The fins 312A and 322A include a plurality of source/drain regions 314A and 324A. The source/drain regions 314A and 324A are doped semiconductor regions located on opposite sides of the corresponding gate structures 331A-338A. In some embodiments, the source/drain regions 314A and 324A include p-type dopants such as boron for formation of p-type FETs. In other embodiments, the source/drain regions 314A and 324A include n-type dopants such as phosphorus for formation of n-type FETs. Example materials and fabrication methods of the source/drain regions 314A and 324A are similar to the description with respect to the source/drain regions 114A and 124A as illustrated in FIGS. 1B-1D, and thus are not repeated for the sake of brevity.

The gate structures 331A-338A extend along the Y direction across the first and second fins 312A and 322A. In some embodiments, the gate structures 331A-338A are high-k metal gate (HKMG) gate structures that may be formed using a gate-last process flow, as described previously with respect to the gate structures 131A-134A as illustrated in FIGS. 1B-1D.

The semiconductor device 300A further includes first source/drain contacts 342A each extending across first source/drain regions 314A of three first fins 312A, and second source/drain contacts 344A each extending across second source/drain regions 324A of three second fins 322A. The semiconductor device 300A further includes gate contacts 371A, 372A, 373A and 374A over the corresponding gate structures 332A, 334A, 335A and 338A, respectively. Example materials and fabrication methods of the source/drain contacts 342A, 344A and gate contacts 371A-374A are similar to the description with respect to the source/drain contacts 143A, 144A and gate contacts 171A, 173A as illustrated in FIGS. 1B-1D, and thus are not repeated for the sake of brevity.

The semiconductor device 300A further includes a plurality of metal lines 361A, 362A, 363A, 364A, 365A, 366A and 367A extending along the X direction on a next level above the gate contacts 371A-374A. The metal lines 363A and 364A are not electrically connected, so as to serve for different nets. The metal line 364A overlaps the gate contacts 371A and 373A and thus electrically connects the gate structures 332A and 335A to a first net NET_1. The metal line 363A overlaps the gate contacts 372A and 374A and thus electrically connects the gate structures 334A and 338A to a second net NET_2. As a result, different nets can be achieved by using two M0 lines, which in turn saves routing resources and improves routing flexibility.

The uppermost metal line 361A shown in FIG. 3B is a Vdd line, and the lowermost metal line 367A as shown in FIG. 3B is a Vss line. The Vdd line 361A is electrically connected to a Vdd voltage (e.g., positive voltage), and the Vss line 367A is electrically connected to a Vss voltage (e.g., electrical ground or a negative voltage). The metal lines 362A-366A are arranged between the Vdd line 361A and the Vss line 367A and may be connected to different voltages than the Vdd line 361A and the Vss line 367A. Example materials and fabrication methods of the metal lines 361A-367A are similar to the description with respect to the metal lines 161A-167A as illustrated in FIGS. 1B-1D, and thus are not repeated for the sake of brevity.

The metal lines 361A-367A are shifted and thus arranged in an asymmetric manner with respect to the fin groups 310A and 320A. For example, the Vdd line 361A overlaps an entirety of a first fin 312A, but the Vss line 367A overlaps only a part of a second fin 322A (e.g., a longitudinal side of the second fin layout pattern 322A). The asymmetric arrangement of the metal lines 361A-367A allows for the metal lines 363A and 364A arranged between the fin groups 310A and 320A and overlapping none of the fins 312A and 322A.

Figure 4A:
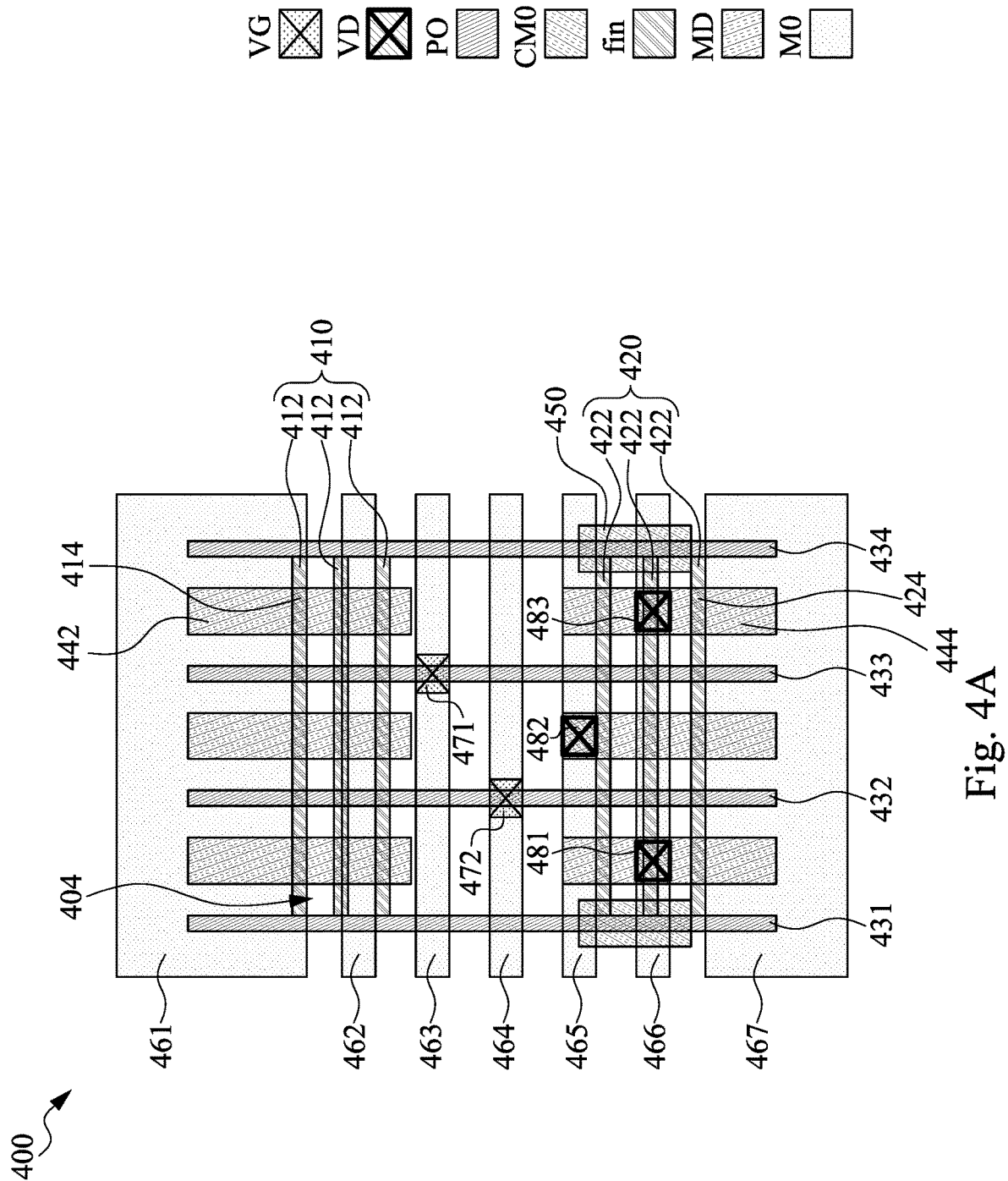
FIG. 4A is a diagram of a layout of a semiconductor device, in accordance with some embodiments.
Figure 4B:
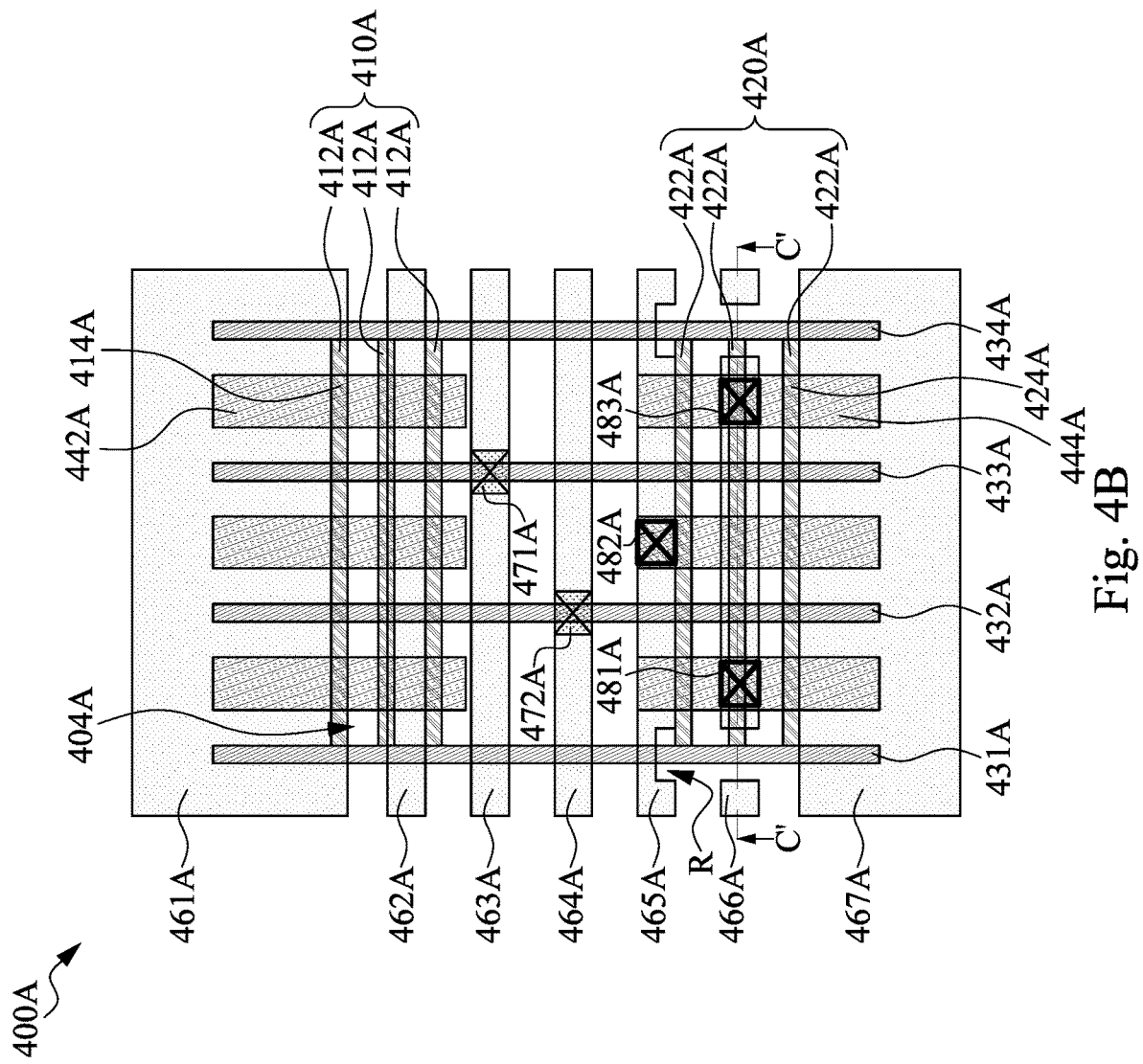
FIGS. 4B-4C are views of a semiconductor device fabricated using the layout of FIG. 4A, in accordance with some embodiments.
Figure 4C:
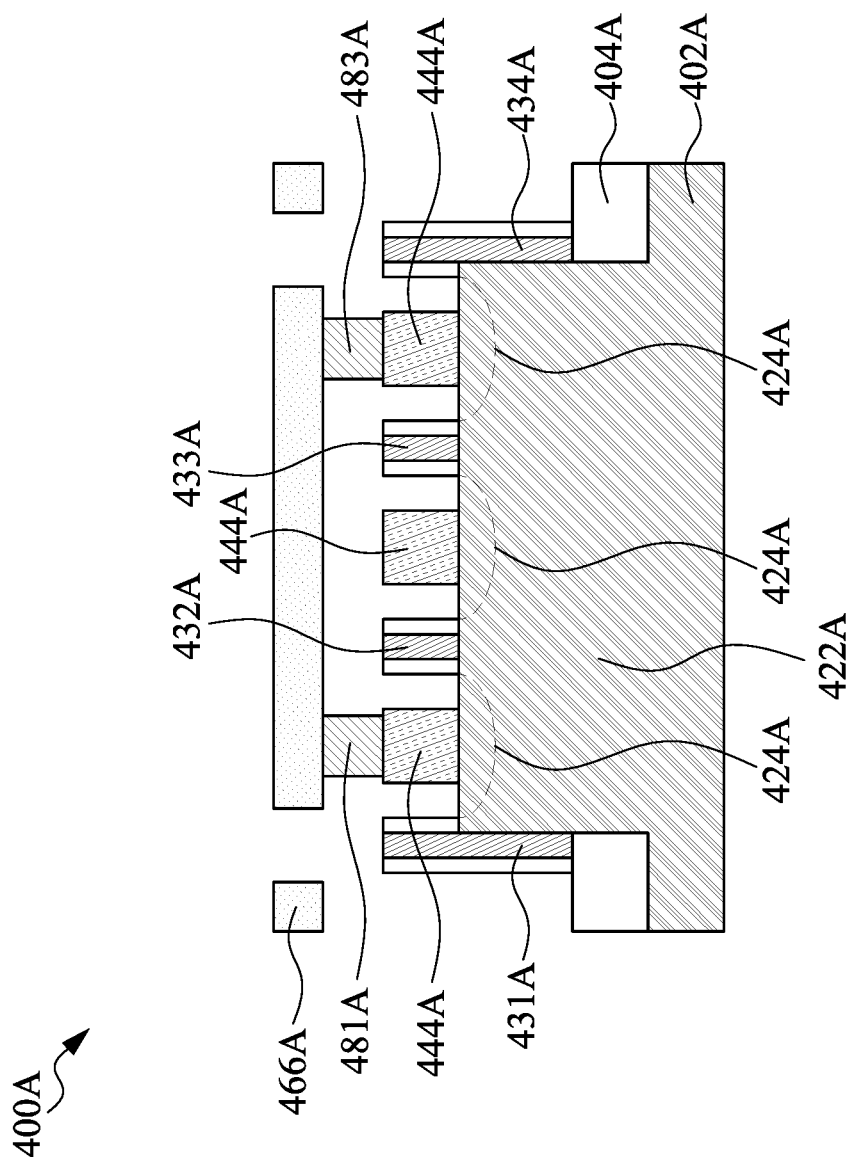

FIG. 4A is a diagram of a layout 400 of a semiconductor device, in accordance with some other embodiments. The layout 400 is usable to manufacture a semiconductor device 400A as illustrated in FIGS. 4B-4C. The layout 400 is similar to the layout 100, except for additional source/drain via layout patterns and different cut patterns, as described in greater detail below. The same or similar configurations as described with FIGS. 1A-1D may be employed in the following embodiments, and the detailed explanation may be omitted.

Referring to FIG. 4A, the layout 400 includes first and second fin group layout patterns 410 and 420. The first and second fin group layout patterns 410 and 420 define corresponding first and second fin group regions 410A and 420A (FIGS. 4B-4C) of the semiconductor device 400A. The first fin group layout pattern 410 includes three first fin layout patterns 412, and the second fin group layout pattern 420 includes three second fin layout patterns 422. The first fin layout patterns 412 each include first source/drain region layout patterns 414 that define corresponding first source/drain regions 414A (FIGS. 4B-4C) of the semiconductor device 400A. Similarly, the second fin layout patterns 422 each include second source/drain region layout patterns 424 that define corresponding second source/drain regions 424A (FIGS. 4B-4C) of the semiconductor device 400A. In some embodiments, fin widths and fin-to-fin spacings of the fin layout patterns 412 and 422 are the same as that of the fin layout patterns 112 and 122 as shown in FIG. 1A, and thus are not repeated for the sake of brevity. The fin layout patterns 412 and 422 are separated from each other and other components of the layout 400 on the same layout level by an isolation structure layout pattern 404. The isolation structure layout pattern 404 defines a corresponding isolation structure 404A (FIGS. 4B-4C) of the semiconductor device 400A.

The layout 400 further includes a plurality of gate layout patterns 431, 432, 433 and 434 extending along the Y direction across the fin group layout patterns 410 and 440. The gate layout patterns 431-434 define corresponding gate structures 431A, 432A, 433A and 434A (FIGS. 4B-4C) of the semiconductor device 400A. The gate layout patterns 431-434 and corresponding source/drain region layout patterns 414 and 424 on opposite sides of the gate layout patterns 431-434 form a plurality of FETs. In some embodiments, gate-to-gate spacings of the gate layout patterns 431-434 are the same as that of the gate layout patterns 131-134 as shown in FIG. 1A, and thus are not repeated for the sake of brevity.

The layout 400 includes a plurality of first source/drain contact layout patterns 442 extending along the Y direction across the first source/drain region layout patterns 414 of three first fins layout patterns 412, and thus the three first fin layout patterns 412 share common source/drain contact layout patterns 442. Similarly, the layout 400 further includes a plurality of second source/drain contact layout patterns 444 extending along the Y direction across the second source/drain region layout patterns 424 of three second fins layout patterns 422, and thus the three second fin layout patterns 422 share common source/drain contact layout patterns 444. The source/drain contact layout patterns 442 and 444 define corresponding source/drain contacts 442A and 444A of the semiconductor device 400A (FIGS. 4B-4C).

The layout 400 further includes a plurality of metal line layout patterns 461, 462, 463, 464, 465, 466 and 467 extending along the X direction and spaced apart from each other along the Y direction. The metal line layout patterns 461-467 define corresponding metal lines 461A-467A (FIGS. 4B-4C) of the semiconductor device 400A. The metal line layout pattern 461 at an upper boundary of the layout 400 is a Vdd line layout pattern, and the metal line layout pattern 467 at a lower boundary of the layout 400 is a Vss line layout pattern that has a smaller width than the width of the Vdd line layout pattern 461. The metal line layout patterns 462-466 are arranged between the Vdd line layout pattern 461 and the Vss line layout pattern 467.

The metal line layout patterns 462-466 are shifted and thus arranged in an asymmetric manner with respect to the fin group layout patterns 410 and 420. For example, the metal line layout patterns 462-466 are shifted toward the second fin group layout pattern 420. The asymmetric arrangement of the metal line layout patterns 462-466 allows for the metal line layout patterns 463 and 464 arranged between the fin group layout patterns 410 and 420 without overlapping any one of the fin layout patterns 412 and 422. In some embodiments, line widths, line-to-line spacings and asymmetric arrangement of the metal line layout patterns 461-467 are the same as that of the metal line layout patterns 161-167 as shown in FIG. 1A, and thus are not repeated for the sake of brevity.

The layout 400 further includes gate contact layout patterns 471 and 472 overlying the corresponding gate layout patterns 433 and 432, respectively. The gate contact layout patterns 471 and 472 define corresponding gate contacts 471A and 472A (FIGS. 4B-4C) of the semiconductor device 400A. The gate contact layout pattern 471 overlaps an intersection of the gate layout pattern 433 and the metal line layout pattern 463, thus providing an electrical connection between the gate layout pattern 433 and the metal line layout pattern 463. The gate contact layout pattern 472 overlaps an intersection of the gate layout pattern 432 and the metal line layout pattern 464, thus providing an electrical connection between the gate layout pattern 432 and the metal line layout pattern 464. In this way, the gate structures 432A and 433A are electrically connected to different metal lines 464A and 463A (FIGS. 4B-4C), which in turn allows for the gate structures 432A and 433A electrically connected to different nets.

The layout 400 further includes two cut layout patterns 450 extending along the Y direction across the metal line layout pattern 466. The cut layout patterns 450 overlap only a portion of the metal line layout pattern 465. Stated differently, the cut layout patterns 450 extend past a lower longitudinal side of the metal line layout pattern 465 and is set back from an upper longitudinal side of the metal line layout pattern 465. The cut layout patterns 450 represent cut sections or patterning area where the metal line layout patterns 465 and 466 are removed according to the integrated circuit design.

The layout 400 further includes source/drain via layout patterns 481, 482 and 483 overlying the corresponding source/drain contact layout patterns 444, respectively. The source/drain via layout patterns 481, 482 and 483 define corresponding source/drain vias 481A, 482A and 483A (FIGS. 4B-4C) of the semiconductor device 400A. The source/drain via layout pattern 481 overlaps an intersection of a left one of the source/drain contact layout patterns 444 and the metal line layout pattern 466, thus providing an electrical connection therebetween. The source/drain via layout pattern 482 overlaps an intersection of a middle one of the source/drain contact layout patterns 444 and the metal line layout pattern 465, thus providing an electrical connection therebetween. The source/drain via layout pattern 483 overlaps an intersection of a right one of the source/drain contact layout patterns 444 and the metal line layout pattern 466, thus providing an electrical connection therebetween. As a result, the layout 400 can use only four M0 line layout patterns (i.e., line patterns 463, 464, 465 and 466) for routing the gate contacts and source/drain vias, which in turn saves routing resources and improves routing flexibility.

FIGS. 4B and 4C are views of a semiconductor device 400A fabricated using the layout 400 in accordance with some embodiments, and thus the semiconductor device 400A inherits geometry of those patterns in the layout 400, as described in greater detail below. FIG. 4B is a top view of the semiconductor device 400A. FIG. 4C is a cross-sectional view of the semiconductor device 400A of FIG. 4B taken along line C-C'. The semiconductor device 400A is a non-limiting example for facilitating the illustration of the present disclosure.

Referring to FIGS. 4B and 4C, the semiconductor device 400A includes a substrate 402A, first and second fin groups 410A and 420A extending upwardly from the substrate 402A, and gate structures 431A, 434A, 433A and 434A extending along the Y direction across the fin groups 410A and 440A. The first fin group 410A includes three first fins 412A extending along the X direction, and the second fin group 420A includes three second fins 422A extending along the X direction as well. Example materials and fabrication methods of the substrate 402A, the fins 412A, 422A are similar to that as shown in FIGS. 1B-1D, and thus are not repeated for the sake of brevity. In some embodiments, fin widths and fin-to-fin spacings of the fins 412A and 422A are the same as that of the fins 112A and 122A as shown in FIG. 1B, and thus are not repeated for the sake of brevity.

The fins 412A and 422A are electrically isolated from each other by an isolation structure 404A. In some embodiments, the isolation structure 404A is a shallow trench isolation (STI) structure including a trench filled with one or more dielectric material. Example materials and fabrication methods of the STI structure 404A are similar to the description with respect to the STI structure 104A as shown in FIGS. 1B-1D, and thus are not repeated for the sake of brevity.

The fins 412A and 422A include a plurality of source/drain regions 414A and 424A. The source/drain regions 414A and 424A are doped semiconductor regions located on opposite sides of the corresponding gate structures 431A-434A. In some embodiments, the source/drain regions 414A and 424A include p-type dopants such as boron for formation of p-type FETs. In other embodiments, the source/drain regions 414A and 424A include n-type dopants such as phosphorus for formation of n-type FETs. Example fabrication methods of the source/drain regions 414A and 424A are similar to the description with respect to the source/drain regions 114A and 124A as illustrated in FIGS. 1B-1D, and thus are not repeated for the sake of brevity.

The gate structures 431A-434A extend along the Y direction across the first and second fins 412A and 422A. In some embodiments, the gate structures 431A-434A are high-k metal gate (HKMG) gate structures that may be formed using a gate-last process flow, as described previously with respect to the gate structures 131A-134A as illustrated in FIGS. 1B-1D. Example materials and fabrication methods of the HKMG gate structures thus are not repeated for the sake of brevity. Gate-to-gate spacings of the gate structures 431A-434A are the same as that of the gate structures 131A-134A, and thus are not repeated for the sake of brevity.

The semiconductor device 400A further includes first source/drain contacts 442A each extending across first source/drain regions 414A of three first fins 412A, and second source/drain contacts 444A each extending across second source/drain regions 424A of three second fins 422A. The semiconductor device 400A further includes a gate contact 471A over the gate structure 433A and a gate contact 472A over the gate structure 432A. Example materials and fabrication methods of the source/drain contacts 442A, 444A and gate contacts 471A, 474A are similar to the description with respect to the source/drain contacts 142A, 144A and gate contacts 171A, 172A as illustrated in FIGS. 1B-1D, and thus are not repeated for the sake of brevity.

The semiconductor device 400A further includes a plurality of metal lines 461A, 462A, 463A, 464A, 465A, 466A and 467A extending along the X direction on a next level above the gate contacts 471A and 474A. The uppermost metal line 461A shown in FIG. 4B is a Vdd line, and the lowermost metal line 467A as shown in FIG. 4B is a Vss line. The Vdd line 461A is electrically connected to a Vdd voltage (e.g., positive voltage), and the Vss line 467A is electrically connected to a Vss voltage (e.g., electrical ground or a negative voltage). The metal lines 462A-466A are arranged between the Vdd line 461A and the Vss line 467A and may be connected to different voltages than the Vdd line 461A and the Vss line 467A. Example materials and fabrication methods of the metal lines 461A-467A are similar to the description with respect to the metal lines 161A-167A as illustrated in FIGS. 1B-1D, and thus are not repeated for the sake of brevity. Line widths, line-to-line spacings and asymmetric arrangement of the metal lines 461A-467A are the same as that of the metal lines 161A-167A as described previously, and thus are not repeated for the sake of brevity.

In the depicted embodiment as shown in FIG. 4B, the metal line 465A has recessed regions R and the metal line 466A is a discontinuous line when viewed from above. This is because the metal lines 465A and 466A are patterned using the cut layout patterns 450 (FIG. 4A). For example, a photoresist is first coated on the semiconductor device 400A and then patterned using the cut layout patterns 450 in the layout 400, and subsequently, the metal lines 465A-466A are patterned by an etching process using the patterned photoresist as a etch mask. As a result of the etching process, the metal line 466A is broken into discontinuous metal lines, and the metal line 465A has recessed regions R, as illustrated in FIG. 4B. Moreover, the metal lines 461A-464A, and 467A remain intact during patterning the metal lines 465A and 466A, because the cut layout patterns 450 non-overlap the metal line layout patterns 461-464, and 467 in the layout 400.

The semiconductor device 400A further includes source/drain vias 481A, 482A and 483A over the source/drain contacts 444A, respectively. The source/drain via 481A is at an intersection of the metal line 466A and a left one of the source/drain contacts 444A, thus providing an electrical connection therebetween. The source/drain via 482A is at an intersection of the metal line 465A and a middle one of the source/drain contacts 444A, thus providing an electrical connection therebetween. The source/drain via 483A is at an intersection of the metal line 466A and a right one of the source/drain contacts 444A, thus providing an electrical connection therebetween. Because both the left one and right one of the source/drain contacts 444A are electrically connected to the metal line 466A, they can be electrically connected to the same voltage.

In some embodiments, source/drain vias 481A-483A include a conductive material such as, for example, cobalt (Co), Cu, W or other suitable metals. Formation of the source/drain vias 481A-483A includes, for example, etching source/drain via openings in a second interlayer dielectric (ILD) layer (which is formed over the first ILD layer, not shown) over the source/drain contacts 444A, depositing one or more conductive materials in the source/drain via openings, and planarizing the one or more conducitve materials by using, for example, a CMP process. In some embodiments, the source/drain vias 481A-483A are formed simultaneously with the gate contacts 471A and 472A, and thus the source/drain vias 481A-483A have the same conductive materials as the gate contacts 471A and 472A. As illustrated in FIG. 4B, the semiconductor device 400A can use only four M0 lines (i.e., metal lines 463A, 464A, 465A and 466A) for routing the gate contacts 471A, 472A and source/drain vias 481A-483A, which in turn saves routing resources and improves routing flexibility.

Figure 5B:
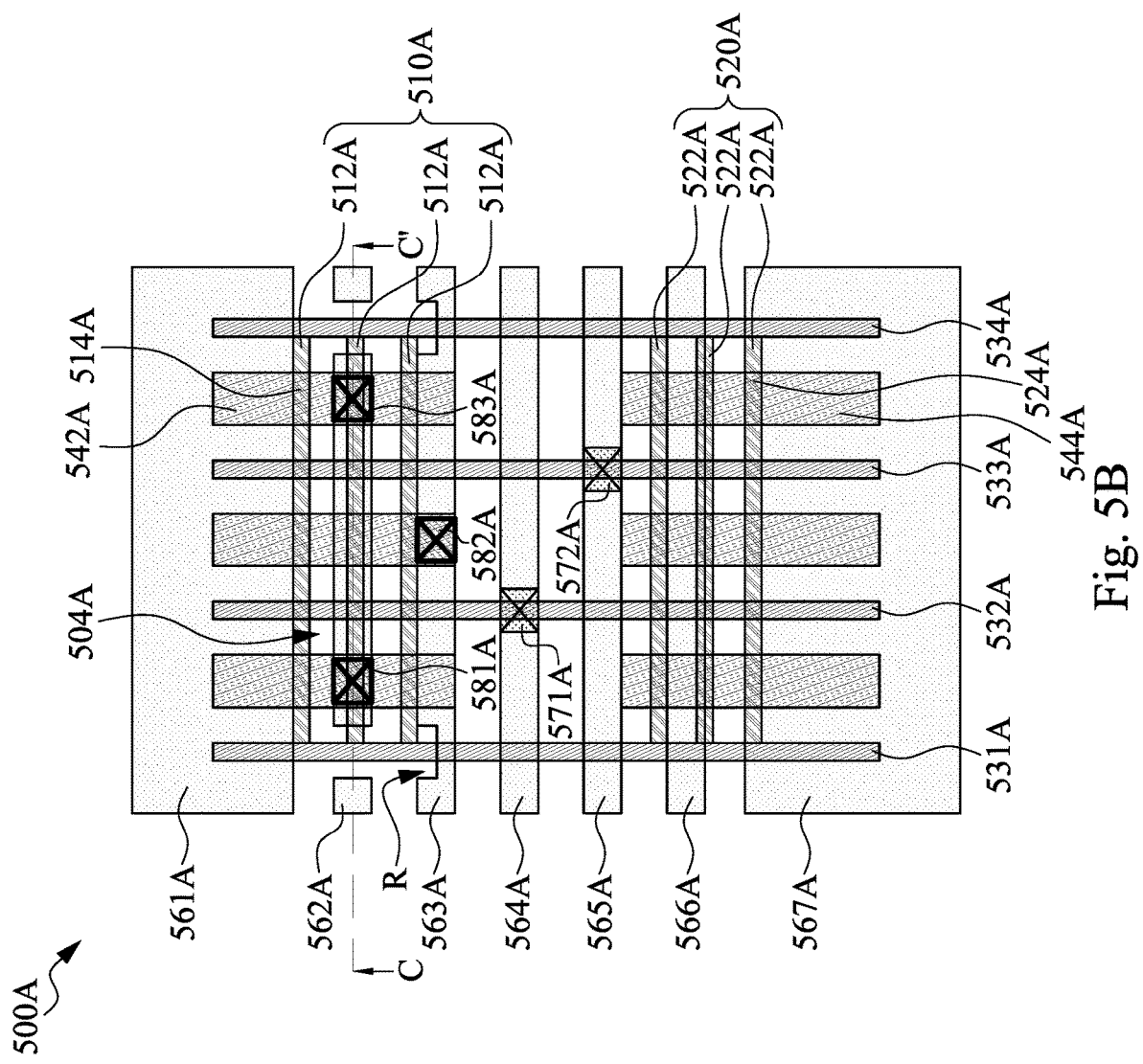
FIGS. 5B-5C are views of a semiconductor device fabricated using the layout of FIG. 5A, in accordance with some embodiments.
Figure 5C:
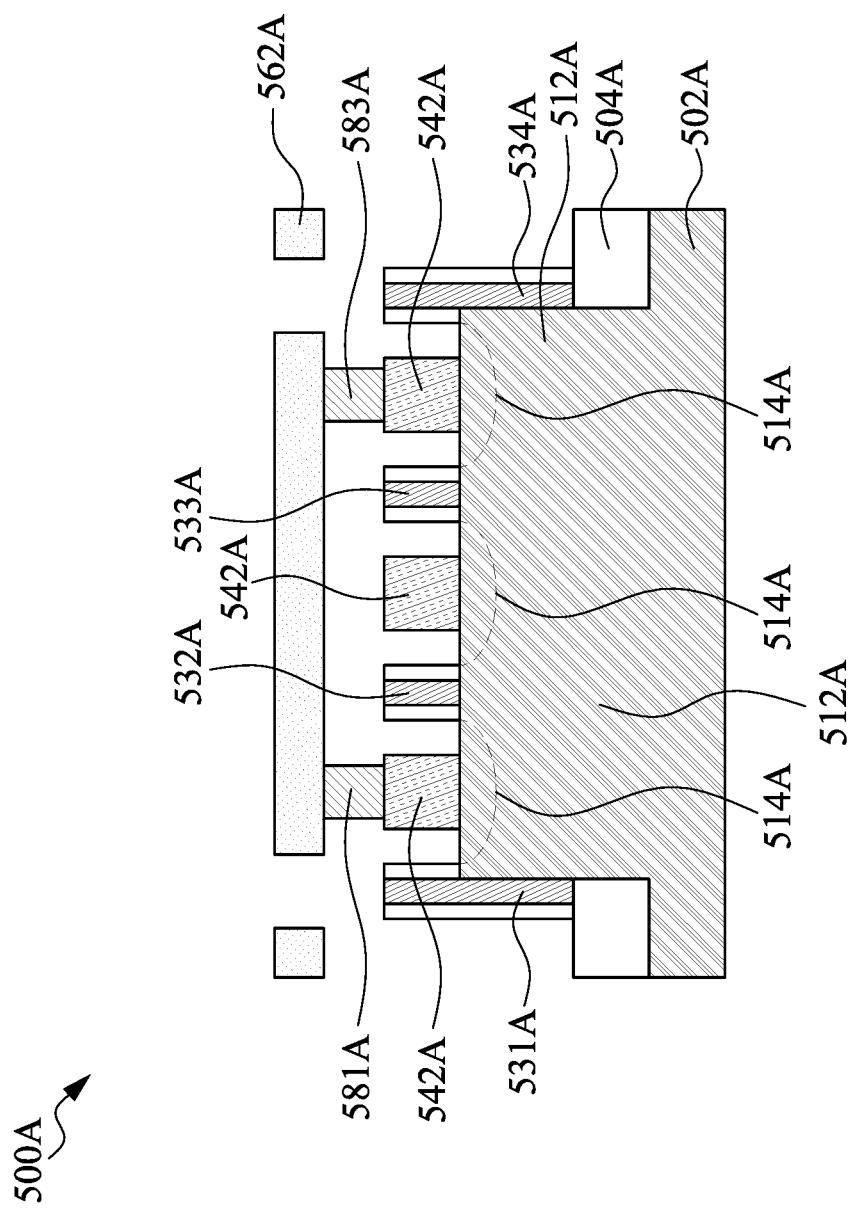

FIG. 5A is a diagram of a layout 500 of a semiconductor device, in accordance with some other embodiments. The layout 500 is usable to manufacture a semiconductor device 500A as illustrated in FIGS. 5B-5C. The layout 500 is similar to the layout 200, except for additional source/drain via layout patterns and different cut patterns, as described in greater detail below. The same or similar configurations as described with FIGS. 2A-2D may be employed in the following embodiments, and the detailed explanation may be omitted.

Referring to FIG. 5A, the layout 500 includes first and second fin group layout patterns 510 and 520. The first and second fin group layout patterns 510 and 520 define corresponding first and second fin group regions 510A and 520A (FIGS. 5B-5C) of the semiconductor device 500A. The first fin group layout pattern 510 includes three first fin layout patterns 512, and the second fin group layout pattern 520 includes three second fin layout patterns 522. The first fin layout patterns 512 each include first source/drain region layout patterns 514 that define corresponding first source/drain regions 514A (FIGS. 5B-5C) of the semiconductor device 500A. Similarly, the second fin layout patterns 522 each include second source/drain region layout patterns 524 that define corresponding second source/drain regions 524A (FIGS. 5B-5C) of the semiconductor device 500A. In some embodiments, fin widths and fin-to-fin spacings of the fin layout patterns 512 and 522 are the same as that of the fin layout patterns 212 and 222 as shown in FIG. 2A, and thus are not repeated for the sake of brevity. The fin layout patterns 512 and 522 are separated from each other and other components of the layout 500 on the same layout level by an isolation structure layout pattern 504. The isolation structure layout pattern 504 defines a corresponding isolation structure 504A (FIGS. 5B-5C) of the semiconductor device 500A.

The layout 500 further includes a plurality of gate layout patterns 531, 532, 533 and 534 extending along the Y direction across the fin group layout patterns 510 and 520. The gate layout patterns 531-534 define corresponding gate structures 531A, 532A, 533A and 534A (FIGS. 5B-5C) of the semiconductor device 500A. The gate layout patterns 531-534 and corresponding source/drain region layout patterns 514 and 524 on opposite sides of the gate layout patterns 531-534 form a plurality of FETs. In some embodiments, gate-to-gate spacings of the gate layout patterns 531-534 are the same as that of the gate layout patterns 231-234 as shown in FIG. 2A, and thus are not repeated for the sake of brevity.

The layout 500 includes a plurality of first source/drain contact layout patterns 542 extending along the Y direction across the first source/drain region layout patterns 514 of three first fins layout patterns 512, and thus the three first fin layout patterns 512 share common source/drain contact layout patterns 542. Similarly, the layout 500 further includes a plurality of second source/drain contact layout patterns 544 extending along the Y direction across the second source/drain region layout patterns 524 of three second fins layout patterns 522, and thus the three second fin layout patterns 522 share common source/drain contact layout patterns 544. The source/drain contact layout patterns 542 and 544 define corresponding source/drain contacts 542A and 544A of the semiconductor device 500A (FIGS. 5B-5C).

The layout 500 further includes a plurality of metal line layout patterns 561, 562, 563, 564, 565, 566 and 567 extending along the X direction and spaced apart from each other along the Y direction. The metal line layout patterns 561-567 define corresponding metal lines 561A-567A (FIGS. 5B-5C) of the semiconductor device 500A. The metal line layout pattern 561 at an upper boundary of the layout 500 is a Vdd line layout pattern, and the metal line layout pattern 567 at a lower boundary of the layout 500 is a Vss line layout pattern that has a greater width than the width of the Vdd line layout pattern 561. The metal line layout patterns 562-566 are arranged between the Vdd line layout pattern 561 and the Vss line layout pattern 567.

The metal line layout patterns 562-566 are shifted and thus arranged in an asymmetric manner with respect to the fin group layout patterns 510 and 520. For example, the metal line layout patterns 562-566 are shifted toward the first fin group layout pattern 510. The asymmetric arrangement of the metal line layout patterns 562-566 allows for the metal line layout patterns 564 and 565 arranged between the fin group layout patterns 510 and 520 without overlapping any one of the fin layout patterns 512 and 522. In some embodiments, line widths, line-to-line spacings and the asymmetric arrangement of the metal line layout patterns 561-567 are the same as that of the metal line layout patterns 261-267 as shown in FIG. 2A, and thus are not repeated for the sake of brevity.

The layout 500 further includes gate contact layout patterns 571 and 572 overlying the corresponding gate layout patterns 532 and 533, respectively. The gate contact layout patterns 571 and 572 define corresponding gate contacts 571A and 572A (FIGS. 5B-5C) of the semiconductor device 500A. The gate contact layout pattern 571 overlaps an intersection of the gate layout pattern 532 and the metal line layout pattern 564, thus providing an electrical connection between the gate layout pattern 532 and the metal line layout pattern 564. The gate contact layout pattern 572 overlaps an intersection of the gate layout pattern 533 and the metal line layout pattern 565, thus providing an electrical connection between the gate layout pattern 533 and the metal line layout pattern 565. In this way, the gate structures 532A and 533A are electrically connected to different metal lines 564A and 565A (FIGS. 5B-5C), which in turn allows for the gate structures 532A and 533A electrically connected to different nets.

The layout 500 further includes two cut layout patterns 550 extending along the Y direction across the metal line layout pattern 562. The cut layout patterns 550 overlap only a portion of the metal line layout pattern 563. Stated differently, the cut layout patterns 550 extend past an upper longitudinal side of the metal line layout pattern 563 and is set back from a lower longitudinal side of the metal line layout pattern 563. The cut layout patterns 550 represent cut sections or patterning area where the metal line layout patterns 562 and 563 are removed according to the integrated circuit design.

The layout 500 further includes source/drain via layout patterns 581, 582 and 583 overlying the corresponding source/drain contact layout patterns 542, respectively. The source/drain via layout patterns 581, 582 and 583 define corresponding source/drain vias 581A, 582A and 583A (FIGS. 5B-5C) of the semiconductor device 500A. The source/drain via layout pattern 581 overlaps an intersection of a left one of the source/drain contact layout patterns 542 and the metal line layout pattern 562, thus providing an electrical connection therebetween. The source/drain via layout pattern 582 overlaps an intersection of a middle one of the source/drain contact layout patterns 542 and the metal line layout pattern 563, thus providing an electrical connection therebetween. The source/drain via layout pattern 583 overlaps an intersection of a right one of the source/drain contact layout patterns 542 and the metal line layout pattern 562, thus providing an electrical connection therebetween. As a result, the layout 500 can use only four M0 line layout patterns (i.e., line patterns 562, 563, 564 and 565) for routing the gate contacts and source/drain vias, which in turn saves routing resources and improves routing flexibility.

FIGS. 5B and 5C are views of a semiconductor device 500A fabricated using the layout 500 in accordance with some embodiments, and thus the semiconductor device 500A inherits geometry of those patterns in the layout 500, as described in greater detail below. FIG. 5B is a top view of the semiconductor device 500A. FIG. 5C is a cross-sectional view of the semiconductor device 500A of FIG. 5B taken along line C-C'. The semiconductor device 500A is a non-limiting example for facilitating the illustration of the present disclosure.

Referring to FIGS. 5B and 5C, the semiconductor device 500A includes a substrate 502A, first and second fin groups 510A and 520A extending upwardly from the substrate 502A, and gate structures 531A, 535A, 533A and 534A extending along the Y direction across the fin groups 510A and 520A. The first fin group 510A includes three first fins 512A extending along the X direction, and the second fin group 520A includes three second fins 522A extending along the X direction as well. Example materials and fabrication methods of the substrate 502A, the fins 512A, 522A are similar to that as shown in FIGS. 2B-2C, and thus are not repeated for the sake of brevity. In some embodiments, fin widths and fin-to-fin spacings of the fins 512A and 522A are the same as that of the fins 212A and 222A as shown in FIG. 2B, and thus are not repeated for the sake of brevity.

The fins 512A and 522A are electrically isolated from each other by an isolation structure 504A. In some embodiments, the isolation structure 504A is a shallow trench isolation (STI) structure including a trench filled with one or more dielectric material. Example materials and fabrication methods of the STI structure 504A are similar to the description with respect to the STI structure 104A as shown in FIGS. 1B-1D, and thus are not repeated for the sake of brevity.

The fins 512A and 522A include a plurality of source/drain regions 514A and 524A. The source/drain regions 514A and 524A are doped semiconductor regions located on opposite sides of the corresponding gate structures 431A-534A. In some embodiments, the source/drain regions 514A and 524A include p-type dopants such as boron for formation of p-type FETs. In other embodiments, the source/drain regions 514A and 524A include n-type dopants such as phosphorus for formation of n-type FETs. Example fabrication methods of the source/drain regions 514A and 524A are similar to the description with respect to the source/drain regions 214A and 224A as illustrated in FIGS. 2B-2C, and thus are not repeated for the sake of brevity.

The gate structures 531A-534A extend along the Y direction across the first and second fins 512A and 522A. In some embodiments, the gate structures 531A-534A are high-k metal gate (HKMG) gate structures that may be formed using a gate-last process flow, as described previously with respect to the gate structures 231A-234A as illustrated in FIGS. 2B-2C. Example materials and fabrication methods of the HKMG gate structures thus are not repeated for the sake of brevity. Gate-to-gate spacings of the gate structures 531A-534A are the same as that of the gate structures 231A-234A, and thus are not repeated for the sake of brevity.

The semiconductor device 500A further includes first source/drain contacts 542A each extending across first source/drain regions 514A of three first fins 512A, and second source/drain contacts 544A each extending across second source/drain regions 524A of three second fins 522A. The semiconductor device 500A further includes a gate contact 571A over the gate structure 532A and a gate contact 572A over the gate structure 533A. Example materials and fabrication methods of the source/drain contacts 542A, 544A and gate contacts 571A, 572A are similar to the description with respect to the source/drain contacts 242A, 244A and gate contacts 271A, 272A as illustrated in FIGS. 2B-2C, and thus are not repeated for the sake of brevity.

The semiconductor device 500A further includes a plurality of metal lines 561A, 562A, 563A, 564A, 565A, 566A and 567A extending along the X direction on a next level above the gate contacts 571A and 572A. The uppermost metal line 561A shown in FIG. 5B is a Vdd line, and the lowermost metal line 567A as shown in FIG. 5B is a Vss line. The Vdd line 561A is electrically connected to a Vdd voltage (e.g., positive voltage), and the Vss line 567A is electrically connected to a Vss voltage (e.g., electrical ground or a negative voltage). The metal lines 562A-566A are arranged between the Vdd line 561A and the Vss line 567A and may be connected to different voltages than the Vdd line 561A and the Vss line 567A. Example materials and fabrication methods of the metal lines 561A-567A are similar to the description with respect to the metal lines 161A-167A as illustrated in FIGS. 1B-1D, and thus are not repeated for the sake of brevity. Line widths, line-to-line spacings and asymmetric arrangement of the metal lines 561A-567A are the same as that of the metal lines 261A-267A as described previously, and thus are not repeated for the sake of brevity.

In the depicted embodiment as shown in FIG. 5B, the metal line 563A has recessed regions R and the metal line 562A is a discontinuous line when viewed from above. This is because the metal lines 562A and 563A are patterned using the cut layout patterns 550 (FIG. 5A). For example, a photoresist is first coated on the semiconductor device 500A and then patterned using the cut layout patterns 550 in the layout 500, and subsequently, the metal lines 562A-563A are patterned by an etching process using the patterned photoresist as a etch mask. As a result of the etching process, the metal line 562A is broken into discontinuous metal lines, and the metal line 563A has recessed regions R, as illustrated in FIG. 5B. Moreover, the metal lines 561A and 564A-567A remain intact during patterning the metal lines 562A and 563A, because the cut layout patterns 550 non-overlap the metal line layout patterns 561 and 564-567 in the layout 500.

The semiconductor device 500A further includes source/drain vias 581A, 582A and 583A over the source/drain contacts 542A, respectively. The source/drain via 581A is at an intersection of the metal line 562A and a left one of the source/drain contacts 542A, thus providing an electrical connection therebetween. The source/drain via 582A is at an intersection of the metal line 563A and a middle one of the source/drain contacts 542A, thus providing an electrical connection therebetween. The source/drain via 583A is at an intersection of the metal line 562A and a right one of the source/drain contacts 542A, thus providing an electrical connection therebetween. Because both the left one and right one of the source/drain contacts 542A are electrically connected to the metal line 562A, they can be electrically connected to the same voltage. Example materials and fabrication methods of the source/drain vias 581A-583A are similar to the description with respect to the source/drain vias 481A-483A as illustrated in FIGS. 4B-4C, and thus are not repeated for the sake of brevity.

Figure 6:
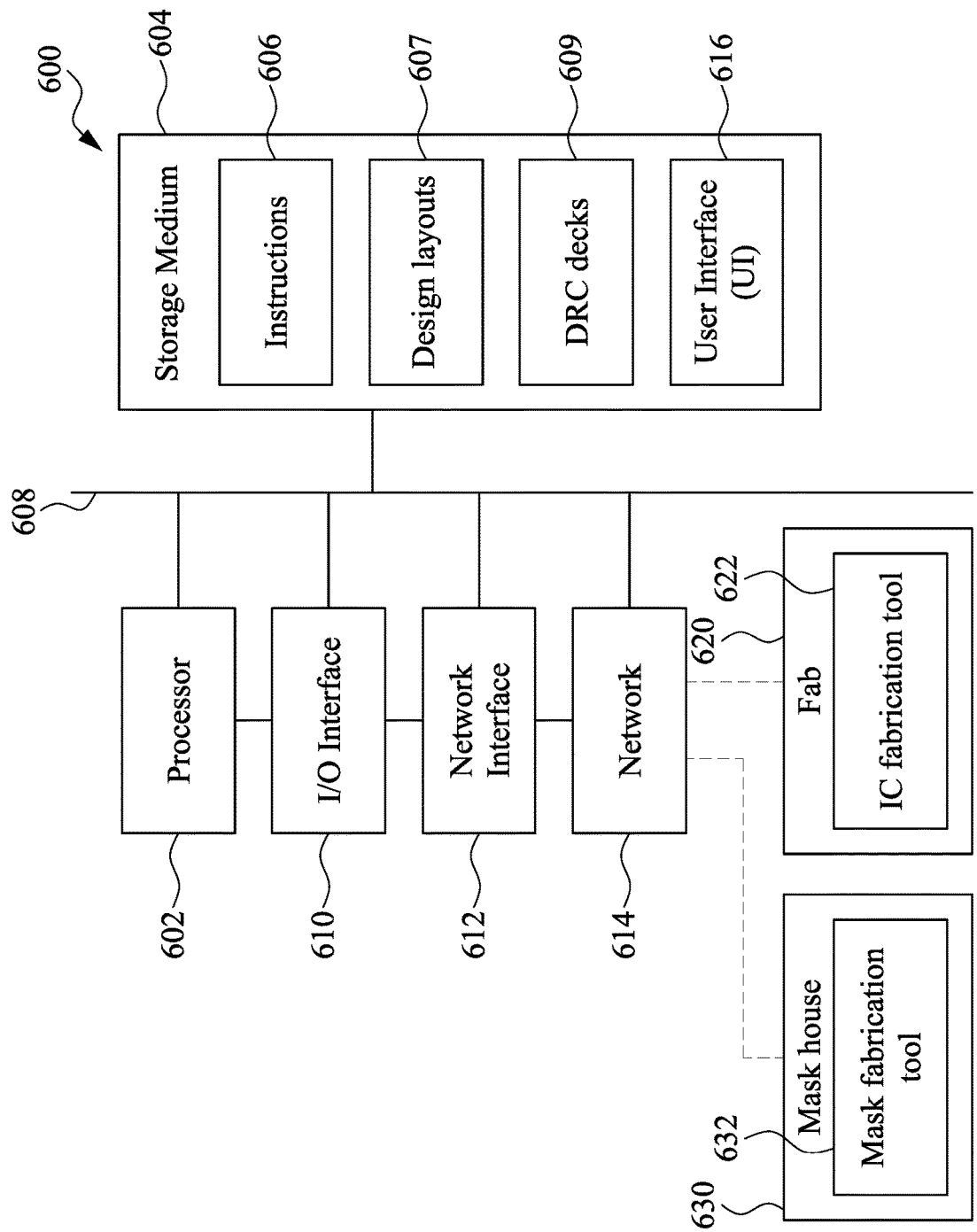
FIG. 6 is a schematic diagram of a system for designing a layout of a semiconductor device, in accordance with some embodiments.

FIG. 6 is a schematic diagram of an electronic design automation (EDA) system 600, in accordance with some embodiments. Methods described herein of generating design layouts, e.g., layouts 100, 200, 300, 400, and 500, in accordance with one or more embodiments, are implementable, for example, using EDA system 600, in accordance with some embodiments. In some embodiments, EDA system 600 is a general purpose computing device including a hardware processor 602 and a non-transitory, computer-readable storage medium 604. Computer-readable storage medium 604, amongst other things, is encoded with, i.e., stores, a set of executable instructions 606, design layouts 607, design rule check (DRC) decks 609 or any intermediate data for executing the set of instructions. Each design layout 607 comprises a graphical representation of an integrated chip, such as for example, a GSII file. Each DRC deck 609 comprises a list of design rules specific to a semiconductor process chosen for fabrication of a design layout 607. Execution of instructions 606, design layouts 607 and DRC decks 609 by hardware processor 602 represents (at least in part) an EDA tool which implements a portion or all of, e.g., the methods described herein in accordance with one or more (hereinafter, the noted processes and/or methods).

Processor 602 is electrically coupled to computer-readable storage medium 604 via a bus 608. Processor 602 is also electrically coupled to an I/O interface 610 by bus 608. A network interface 612 is also electrically connected to processor 602 via bus 608. Network interface 612 is connected to a network 614, so that processor 602 and computer-readable storage medium 604 are capable of connecting to external elements via network 614. Processor 602 is configured to execute instructions 606 encoded in computer-readable storage medium 604 in order to cause EDA system 600 to be usable for performing a portion or all of the noted processes and/or methods. In one or more embodiments, processor 602 is a central processing unit (CPU), a multi-processor, a distributed processing system, an application specific integrated circuit (ASIC), and/or a suitable processing unit.

In one or more embodiments, computer-readable storage medium 604 is an electronic, magnetic, optical, electromagnetic, infrared, and/or a semiconductor system (or apparatus or device). For example, computer-readable storage medium 604 includes a semiconductor or solid-state memory, a magnetic tape, a removable computer diskette, a random access memory (RAM), a read-only memory (ROM), a rigid magnetic disk, and/or an optical disk. In one or more embodiments using optical disks, computer-readable storage medium 604 includes a compact disk-read only memory (CD-ROM), a compact disk-read/write (CD-R/W), and/or a digital video disc (DVD).

In one or more embodiments, computer-readable storage medium 604 stores instructions 606, design layouts 607 (e.g., layouts 100, 200, 300, 400 and 500 discussed previously) and DRC decks 609 configured to cause EDA system 600 (where such execution represents (at least in part) the EDA tool) to be usable for performing a portion or all of the noted processes and/or methods. In one or more embodiments, storage medium 604 also stores information which facilitates performing a portion or all of the noted processes and/or methods.

EDA system 600 includes I/O interface 610. I/O interface 610 is coupled to external circuitry. In one or more embodiments, I/O interface 610 includes a keyboard, keypad, mouse, trackball, trackpad, touchscreen, and/or cursor direction keys for communicating information and commands to processor 602.

EDA system 600 also includes network interface 612 coupled to processor 602. Network interface 612 allows EDA system 600 to communicate with network 614, to which one or more other computer systems are connected. Network interface 612 includes wireless network interfaces such as BLUETOOTH, WIFI, WIMAX, GPRS, or WCDMA; or wired network interfaces such as ETHERNET, USB, or IEEE-1366. In one or more embodiments, a portion or all of noted processes and/or methods, is implemented in two or more EDA systems 600.

EDA system 600 is configured to receive information through I/O interface 610. The information received through I/O interface 610 includes one or more of instructions, data, design rules, libraries of standard cells, and/or other parameters for processing by processor 602. The information is transferred to processor 602 via bus 608. EDA system 600 is configured to receive information related to a user interface (UI) 616 through I/O interface 610. The information is stored in computer-readable medium 604 as UI 616.

In some embodiments, a layout diagram which includes standard cells is generated using a tool such as VIRTUOSO® available from CADENCE DESIGN SYSTEMS, Inc., or another suitable layout generating tool.

In some embodiments, the processes are realized as functions of a program stored in a non-transitory computer readable recording medium. Examples of a non-transitory computer readable recording medium include, but are not limited to, external/removable and/or internal/built-in storage or memory unit, e.g., one or more of an optical disk, such as a DVD, a magnetic disk, such as a hard disk, a semiconductor memory, such as a ROM, a RAM, a memory card, and the like.

Also illustrated in FIG. 6 are fabrication tools associated with the EDA system 600. For example, a mask house 630 receives a design layout from the EDA system 600 by, for example, the network 614, and the mask house 630 has a mask fabrication tool 632 (e.g., a mask writer) for fabricating one or more photomasks (e.g., photomasks used for fabricating e.g., semiconductor devices 100A, 200A, 300A, 400A and/or 500A) based on the design layout generated from the EDA system 600. An IC fabricator ("Fab") 620 may be connected to the mask house 630 and the EDA system 600 by, for example, the network 614. Fab 620 includes an IC fabrication tool 622 for fabricating IC chips (e.g., semiconductor devices 100A, 200A, 300A, 400A and/or 500A) using the photomasks fabricated by the mask house 630. By way of example and not limitation, the IC fabrication tool 622 includes one or more cluster tools for fabricating IC chips. The cluster tool may be a multiple reaction chamber type composite equipment which includes a polyhedral transfer chamber with a wafer handling robot inserted at the center thereof, a plurality of process chambers (e.g., CVD chamber, PVD chamber, etching chamber, annealing chamber or the like) positioned at each wall face of the polyhedral transfer chamber; and a loadlock chamber installed at a different wall face of the transfer chamber.

Figure 7:
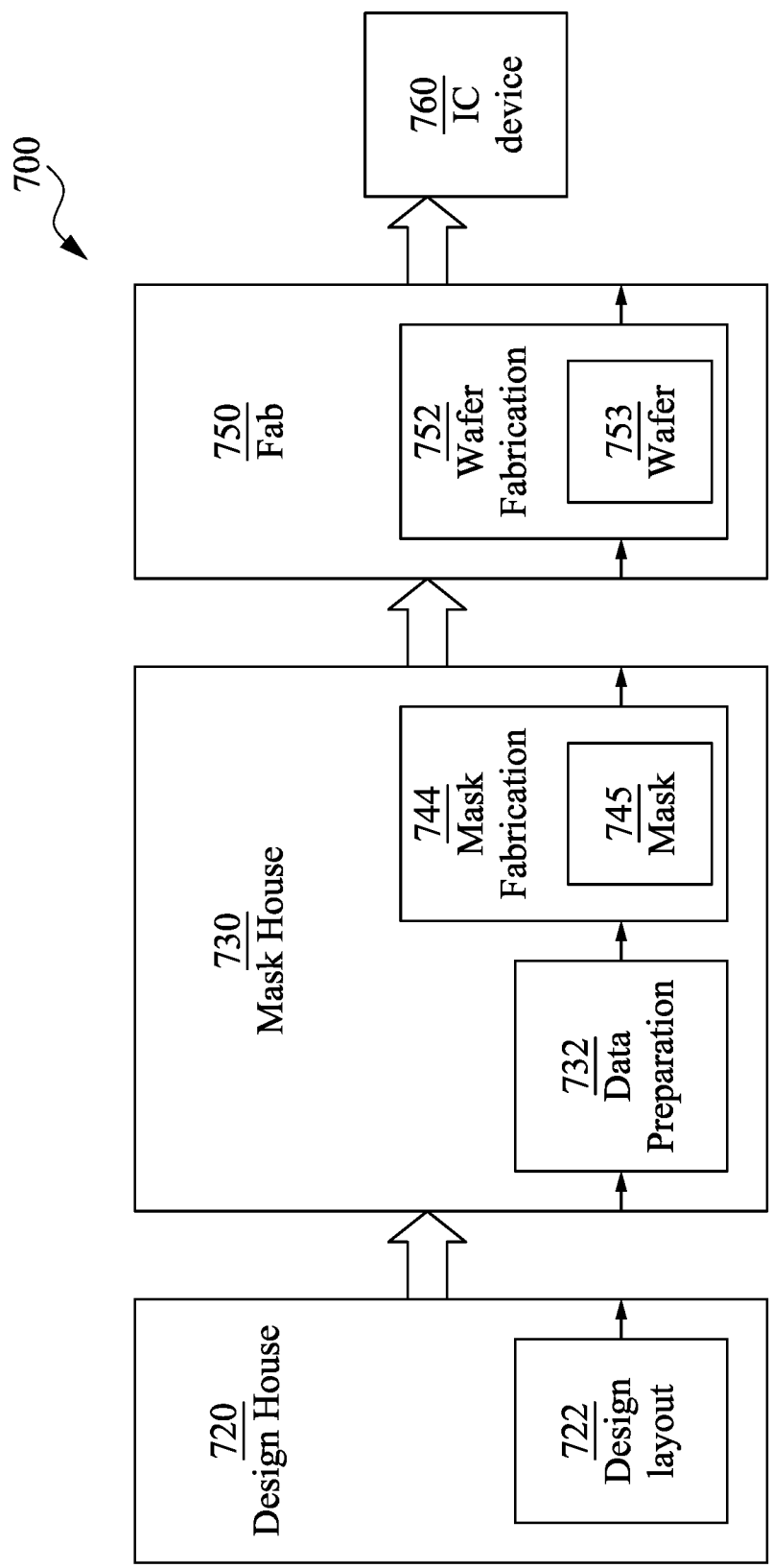
FIG. 7 is a block diagram of a semiconductor device manufacturing system, in accordance with some embodiments.

FIG. 7 is a block diagram of a semiconductor device manufacturing system 700, and a device manufacturing flow associated therewith, in accordance with some embodiments. In some embodiments, based on design layout, e.g., layout 100, 200, 300, 400 or 500, at least one of one or more photomasks or at least one component in a layer of a semiconductor device is fabricated using manufacturing system 700.

In FIG. 7, a device manufacturing system 700 includes entities, such as a design house 720, a mask house 730, and a Fab 750, that interact with one another in the design, development, and manufacturing cycles and/or services related to manufacturing semiconductor devices 760. The entities in device manufacturing system 700 are connected by a communications network. In some embodiments, the communications network is a single network. In some embodiments, the communications network is a variety of different networks, such as an intranet and the Internet. The communications network includes wired and/or wireless communication channels. Each entity interacts with one or more of the other entities and provides services to and/or receives services from one or more of the other entities. In some embodiments, two or more of design house 720, mask house 730, and Fab 750 is owned by a single larger company. In some embodiments, two or more of design house 720, mask house 730, and Fab 750 coexist in a common facility and use common resources.

Design house (or design team) 720 generates design layouts 722 (e.g., layouts 100, 200, 300, 400 and/or 500). Design layouts 722 include various geometrical patterns designed for semiconductor devices 760 (e.g., semiconductor devices 100A, 200A, 300A, 400A and/or 500A). The geometrical patterns correspond to patterns of metal, oxide, or semiconductor layers that make up the various components of semiconductor devices 760 to be fabricated. The various layers combine to form various device features. For example, a portion of design layout 722 includes various circuit features, such as an semiconductor fins, gate structures, gate contacts, source/drain contacts, source/drain vias, and metal lines and/or vias of interconnection, to be formed on a substrate (such as a silicon wafer). Design house 720 implements a proper design procedure to form design layout 722. The design procedure includes one or more of logic design, physical design or place and route. Design layout 722 is presented in one or more data files having information of the geometrical patterns and a netlist of various nets. For example, design layout 722 can be expressed in a GDSII file format or DFII file format.

Mask house 730 includes data preparation 732 and mask fabrication 744. Mask house 730 uses design layout 722 (e.g., layout 100, 200, 300, 400 or 500) to manufacture one or more masks 745 to be used for fabricating the various layers of semiconductor device 760 according to design layout 722. Mask house 730 performs mask data preparation 732, where design layout 722 is translated into a representative data file ("RDF"). Mask data preparation 732 provides the RDF to mask fabrication 744. Mask fabrication 744 includes a mask writer. A mask writer converts the RDF to an image on a substrate, such as a photomask (reticle) 745 or a semiconductor wafer 753. Design layout 722 is manipulated by mask data preparation 732 to comply with particular characteristics of the mask writer and/or rules of fab 750. In FIG. 7, mask data preparation 732 and mask fabrication 744 are illustrated as separate elements. In some embodiments, mask data preparation 732 and mask fabrication 744 can be collectively referred to as mask data preparation.

In some embodiments, mask data preparation 732 includes optical proximity correction (OPC) which uses lithography enhancement techniques to compensate for image errors, such as those that can arise from diffraction, interference, other process effects and the like. OPC adjusts design layout 722. In some embodiments, mask data preparation 732 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, mask data preparation 732 includes a mask rule checker (MRC) that checks design layout 722 that has undergone processes in OPC with a set of mask creation rules which contain certain geometric and/or connectivity restrictions to ensure sufficient margins, to account for variability in semiconductor manufacturing processes, and the like. In some embodiments, the MRC modifies design layout diagram 722 to compensate for limitations during mask fabrication 744, which may undo part of the modifications performed by OPC in order to meet mask creation rules.

In some embodiments, mask data preparation 732 includes lithography process checking (LPC) that simulates processing that will be implemented by Fab 750 to fabricate semiconductor device 760. LPC simulates this processing based on design layout 722 to create a simulated manufactured device, such as semiconductor device 760. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus ("DOF"), mask error enhancement factor ("MEEF"), other suitable factors, and the like or combinations thereof. In some embodiments, after a simulated manufactured device has been created by LPC, if the simulated device is not close enough in shape to satisfy design rules, OPC and/or MRC are be repeated to further refine design layout 722.

One of ordinary skill would understand that the above description of mask data preparation 732 has been simplified for the purposes of clarity. In some embodiments, data preparation 732 includes additional features such as a logic operation (LOP) to modify design layout 722 according to manufacturing rules. Additionally, the processes applied to design layout 722 during data preparation 732 may be executed in a variety of different orders.

After mask data preparation 732 and during mask fabrication 744, a photomask 745 or a group of photomasks 745 are fabricated based on the design layout 722. In some embodiments, mask fabrication 744 includes performing one or more lithographic exposures based on the design layout 722. In some embodiments, an electron-beam (e-beam) or a mechanism of multiple e-beams is used to form a pattern on a photomask 745 based on design layout 722. Photomask 745 can be formed in various technologies. In some embodiments, photomask 745 is formed using binary technology. In some embodiments, a mask pattern includes opaque regions and transparent regions. A radiation beam, such as an ultraviolet (UV) beam, used to expose the radiation sensitive material layer (e.g., photoresist) which has been coated on a wafer, is blocked by the opaque regions and transmits through the transparent regions. In one example, a binary mask version of photomask 745 includes a transparent substrate (e.g., fused quartz) and an opaque material (e.g., chromium) coated in the opaque regions of the binary mask. In another example, photomask 745 is formed using a phase shift technology. In a phase shift mask (PSM) version of photomask 745, various features in the pattern formed on the phase shift photomask are configured to have proper phase difference to enhance the resolution and imaging quality. In various examples, the phase shift photomask can be attenuated PSM or alternating PSM. The photomask(s) generated by mask fabrication 744 is used in a variety of processes. For example, such a mask(s) is used in an ion implantation process to form various doped regions in semiconductor wafer 753, in an etching process to form various etching regions in semiconductor wafer 753, and/or in other suitable processes.

Fab 750 includes wafer fabrication 752. Fab 750 is an IC fabrication business that includes one or more manufacturing facilities for the fabrication of a variety of different IC products. In some embodiments, Fab 750 is a semiconductor foundry. For example, there may be a manufacturing facility for the front end fabrication of a plurality of IC products (front-end-of-line (FEOL) fabrication), while a second manufacturing facility may provide the back end fabrication for the interconnection and packaging of the IC products (BEOL fabrication), and a third manufacturing facility may provide other services for the foundry business.

Fab 750 uses photomask(s) 745 fabricated by mask house 730 to fabricate semiconductor devices 760. Thus, fab 750 at least indirectly uses design layout 722 to fabricate semiconductor devices 760. In some embodiments, semiconductor wafer 753 is fabricated by fab 750 using photomask(s) 745 to form semiconductor devices 760. In some embodiments, the device fabrication includes performing one or more photolithographic exposures based at least indirectly on design layout 722. Semiconductor wafer 753 includes a silicon substrate or other proper substrate having material layers formed thereon. Semiconductor wafer 753 further includes one or more of various doped regions, dielectric features, multilevel interconnects, and the like (formed at subsequent manufacturing steps).

Based on the above discussions, it can be seen that the present disclosure offers advantages. It is understood, however, that other embodiments may offer additional advantages, and not all advantages are necessarily disclosed herein, and that no particular advantage is required for all embodiments. One advantage is that the asymmetric arrangement of M0 lines allows for multiple M0 lines (e.g., two M0 lines) arranged between neighboring fin groups without overlapping any fin of the fin groups, which in turn allows for multiple gate contacts (e.g., two gate contacts) overlapping the M0 lines to be electrically connected to different nets without either fin number reduction or additional photolithography and etching steps. Another advantage is that the width difference between the Vdd line and Vss line is helpful for arranging asymmetrically arranged M0 lines equidistantly.

In some embodiments, a semiconductor device includes a first group of semiconductor fin, a second group of semiconductor fins, a first gate structure, a Vdd line and a Vss line. The first group of semiconductor fins extends along a first direction and arranged at a first fin-to-fin spacing. The second group of semiconductor fins extends along the first direction and arranged at a second fin-to-fin spacing. The second group of semiconductor fins is separated from the first group of semiconductor fins by a fin-free region larger than the first fin-to-fin spacing and the second fin-to-fin spacing. The first gate structure extends across the first group of semiconductor fins, the fin-free region, and the second group of semiconductor fins along a second direction different from the first direction. The Vdd line and the Vss line extend along the first direction over the first gate structure. The first group of semiconductor fins and the second group of semiconductor fins are between the Vdd line and the Vss line from a top view, and an overlapping area between the Vdd line and the first group of semiconductor fins is different from an overlapping area between the Vss line and the second group of semiconductor fins from the top view.

In some embodiments, a semiconductor device includes a first group of semiconductor fins, a second group of semiconductor fins, a first gate structure, a second gate structure, a first metal line, a second metal line, a first gate contact, a second gate contact, a Vdd line and a Vss line. The first group of semiconductor fins and the second group of semiconductor fins extend along a first direction and spaced apart by a fin-free region. The first gate structure and the second gate structure extend across the first group of semiconductor fins, the fin-free region, and the second group of semiconductor fins along a second direction different from the first direction. The first metal line and the second metal line extending within the fin-free region along the first direction. The first gate contact overlaps an intersection of the first metal line and the first gate structure from a top view, and the second gate contact overlaps an intersection of the second metal line and the second gate structure from the top view. Vdd line and Vss line extend on the same level as the first and second metal lines. The Vdd line is adjacent the first group of semiconductor fins, the Vss line is adjacent the second group of semiconductor fins, and the Vdd line and the Vss line have different widths.

In some embodiments, a method includes generating, in a layout, a first group of fin layout patterns and a second group of fin layout patterns extending along a first direction, the first group of fin layout patterns and the second group of fin layout patterns being symmetric about a symmetric axis; generating, in the layout, a plurality of gate layout patterns extending along a second direction across the first group of fin layout patterns and the second group of fin layout patterns, the second direction being different from the first direction; generating, in the layout, a plurality of metal line layout patterns extending along the first direction across the plurality of gate layout patterns, the metal line layout patterns being asymmetric about the symmetric axis of the first group of fin layout patterns and the second group of fin layout patterns; and fabricating a semiconductor device based on the layout.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a first group of semiconductor fins extending along a first direction and arranged at a first fin-to-fin spacing;
   a second group of semiconductor fins extending along the first direction and arranged at a second fin-to-fin spacing, the second group of semiconductor fins being separated from the first group of semiconductor fins by a fin-free region larger than the first fin-to-fin spacing and the second fin-to-fin spacing;
   a first gate structure extending across the first group of semiconductor fins, the fin-free region, and the second group of semiconductor fins along a second direction different from the first direction; and
   a Vdd line and a Vss line extending along the first direction over the first gate structure, wherein the first group of semiconductor fins and the second group of semiconductor fins are between the Vdd line and the Vss line from a top view, and an overlapping area between the Vdd line and the first group of semiconductor fins is different from an overlapping area between the Vss line and the second group of semiconductor fins from the top view.

2. The semiconductor device of claim 1, wherein the overlapping area between the Vdd line and the first group of semiconductor fins is greater than the overlapping area between the Vss line and the second group of semiconductor fins from the top view.

3. The semiconductor device of claim 1, wherein the overlapping area between the Vss line and the second group of semiconductor fins is greater than the overlapping area between the Vdd line and the first group of semiconductor fins from the top view.

4. The semiconductor device of claim 1, wherein the Vdd line and the Vss line have different widths.

5. The semiconductor device of claim 1, wherein the Vdd line is wider than the Vss line from the top view.

6. The semiconductor device of claim 1, wherein the Vss line is wider than the Vdd line from the top view.

7. The semiconductor device of claim 1, further comprising:
   a plurality of first metal lines extending on the same level as the Vdd line and the Vss line, the plurality of first metal lines non-overlapping both the first group of semiconductor fins and the second group of semiconductor fins.

8. The semiconductor device of claim 7, further comprising:
   a first gate contact electrically connecting the first gate structure to one of the plurality of first metal lines.

9. The semiconductor device of claim 8, further comprising:
   a second gate structure extending across the first group of semiconductor fins, the fin-free region, and the second group of semiconductor fins along the second direction; and
   a second gate contact electrically connecting the second gate structure to another of the plurality of first metal lines.

10. The semiconductor device of claim 7, further comprising:
    at least one second metal line extending on the same level as the Vdd line and the Vss line, the at least one second metal line being between the Vdd line and the plurality of first metal lines; and
    at least one third metal line extending on the same level as the Vdd line and the Vss line, the at least one third metal line being between the Vss line and the plurality of first metal lines, wherein a number of the at least one second metal line is different from a number of the at least one third metal line.

11. A semiconductor device, comprising:
    a first group of semiconductor fins and a second group of semiconductor fins extending along a first direction and spaced apart by a fin-free region;
    a first gate structure and a second gate structure extending across the first group of semiconductor fins, the fin-free region, and the second group of semiconductor fins along a second direction different from the first direction;
    a first metal line and a second metal line extending within the fin-free region along the first direction;

a first gate contact overlapping an intersection of the first metal line and the first gate structure from a top view;

a second gate contact overlapping an intersection of the second metal line and the second gate structure from the top view; and a Vdd line and a Vss line extending on the same level as the first and second metal lines, wherein the Vdd line is adjacent the first group of semiconductor fins, the Vss line is adjacent the second group of semiconductor fins, and the Vdd line and the Vss line have different widths.

12. The semiconductor device of claim 11, wherein the width of the Vdd line is greater than the width of the Vss line.

13. The semiconductor device of claim 11, wherein the width of the Vss line is greater than the width of the Vdd line.

14. The semiconductor device of claim 11, further comprising:
a plurality of first source/drain contacts extending across the first group of semiconductor fins, wherein both the first and second metal lines non-overlap the plurality of first source/drain contacts.

15. The semiconductor device of claim 14, further comprising:
a plurality of second source/drain contacts extending across the second group of semiconductor fins, wherein both the first and second metal lines also non-overlap the plurality of second source/drain contacts.

16. The semiconductor device of claim 15, further comprising:
a plurality of source/drain vias over the plurality of the second source/drain contacts, respectively; and
a third metal line extending on the same level as the first and second metal lines and overlapping the plurality of source/drain vias.

17. The semiconductor device of claim 14, further comprising:
a plurality of source/drain vias over the plurality of the first source/drain contacts, respectively; and
a third metal line extending on the same level as the first and second metal lines and overlapping the plurality of source/drain vias.

18. A method, comprising:
generating, in a layout, a first group of fin layout patterns and a second group of fin layout patterns extending along a first direction, the first group of fin layout patterns and the second group of fin layout patterns being symmetric about a symmetric axis;

generating, in the layout, a plurality of gate layout patterns extending along a second direction across the first group of fin layout patterns and the second group of fin layout patterns, the second direction being different from the first direction;

generating, in the layout, a plurality of metal line layout patterns extending along the first direction across the plurality of gate layout patterns, the metal line layout patterns being asymmetric about the symmetric axis of the first group of fin layout patterns and the second group of fin layout patterns; and fabricating a semiconductor device based on the layout.

19. The method of claim 18, further comprising:
generating, in the layout, a first gate contact layout pattern overlapping an intersection of a first gate layout pattern of the plurality of gate layout patterns and a first metal line layout pattern of the plurality of metal line layout patterns; and generating, in the layout, a second gate contact layout pattern overlapping an intersection of a second gate layout pattern of the plurality of gate layout patterns and a second metal line layout pattern of the plurality of metal line layout patterns, wherein both the first and second metal line layout patterns non-overlap the first group of fin layout patterns and the second group of fin layout patterns.

20. The method of claim 19, further comprising:
generating, in the layout, a plurality of first source/drain contact layout patterns extending along the second direction across the first group of fin layout patterns; and generating, in the layout, a plurality of second source/drain contact layout patterns extending along the second direction across the second group of fin layout patterns, wherein both the first and second metal line layout patterns non-overlap the plurality of first source/drain contact layout patterns and the plurality of second source/drain contact layout patterns.

* * * * *